United States Patent
Itoh et al.

(10) Patent No.: US 11,420,905 B2
(45) Date of Patent: Aug. 23, 2022

(54) CERAMIC SUBSTRATE AND PRODUCTION METHOD FOR SAME

(71) Applicant: HITACHI METALS, LTD., Tokyo (JP)

(72) Inventors: Hiroyuki Itoh, Mishima-gun (JP); Shinroh Itoh, Mishima-gun (JP)

(73) Assignee: HITACHI METALS, LTD., Tokyo (JP)

( * ) Notice: Subject to any disclaimer, the term of this patent is extended or adjusted under 35 U.S.C. 154(b) by 1053 days.

(21) Appl. No.: 16/075,819

(22) PCT Filed: Mar. 10, 2017

(86) PCT No.: PCT/JP2017/009754
§ 371 (c)(1),
(2) Date: Aug. 6, 2018

(87) PCT Pub. No.: WO2017/169664
PCT Pub. Date: Oct. 5, 2017

(65) Prior Publication Data
US 2019/0047915 A1    Feb. 14, 2019

(30) Foreign Application Priority Data
Mar. 30, 2016   (JP) .............................. JP2016-069142

(51) Int. Cl.
*H05K 1/03* (2006.01)
*C04B 35/195* (2006.01)
(Continued)

(52) U.S. Cl.
CPC ............ *C04B 35/195* (2013.01); *C04B 37/00* (2013.01); *C04B 37/001* (2013.01); *H01L 23/12* (2013.01);
(Continued)

(58) Field of Classification Search
CPC .. H05K 1/0306; H05K 3/46; H05K 2201/068; H05K 3/4629; H05K 1/03
(Continued)

(56) References Cited

U.S. PATENT DOCUMENTS 5,294,750 A * 3/1994 Sakai ................ H01L 23/49822
257/E23.113
6,110,596 A   8/2000 Kasori et al.
(Continued)

FOREIGN PATENT DOCUMENTS

JP   04-212441 A   8/1992
JP   09-097865 A   4/1997
(Continued)

OTHER PUBLICATIONS

International Search Report of PCT/JP2017/009754 dated May 30, 2017 [PCT/ISA/210].
(Continued)

*Primary Examiner* — Sherman Ng
(74) *Attorney, Agent, or Firm* — Sughrue Mion, PLLC

(57) ABSTRACT

The present invention focuses on a silicon nitride substrate having high mechanical strength, high thermal conductivity and the like, and takes advantage of such properties to provide: a ceramic substrate capable of providing improvement in a bonding property between a silicon nitride substrate and a ceramic layer which uses a dielectric ceramic material capable of being simultaneously sintered with a low-resistance conductive material such as a low-melting metal (Ag or Cu); and a method for producing the ceramic substrate. The ceramic substrate of the present invention is obtained by stacking and bonding a silicon nitride substrate and a ceramic layer composed of a dielectric ceramic material, wherein: the dielectric ceramic material contains Mg, Al, and Si as main ingredients, and Bi or B as an
(Continued)

accessory ingredient; and the ceramic layer includes a region with a high Si element concentration at a bonding interface with the silicon nitride substrate.

10 Claims, 13 Drawing Sheets

(51) Int. Cl.
*H01L 23/13* (2006.01)
*H05K 3/46* (2006.01)
*H01L 23/12* (2006.01)
*C04B 37/00* (2006.01)

(52) U.S. Cl.
CPC ............... *H01L 23/13* (2013.01); *H05K 1/03* (2013.01); *H05K 1/0306* (2013.01); *H05K 3/46* (2013.01)

(58) Field of Classification Search
USPC ......................................................... 174/256
See application file for complete search history.

(56) References Cited

U.S. PATENT DOCUMENTS

| 2002/0084103 | A1* | 7/2002 | Komatsu | ................. H01L 23/15 257/E23.009 |
| 2003/0138641 | A1* | 7/2003 | Fukudome | .............. F01D 5/284 428/689 |
| 2010/0260988 | A1 | 10/2010 | Schulz-Harder | |
| 2013/0182397 | A1 | 7/2013 | Abe et al. | |

FOREIGN PATENT DOCUMENTS

| JP | 09-153568 A | 6/1997 |
| JP | 2009-504547 A | 2/2009 |
| JP | 2012-033664 A | 2/2012 |

OTHER PUBLICATIONS

International Preliminary Report on Patentability and Translation of Written Opinion, dated Oct. 11, 2018 from the International Bureau in counterpart International application No. PCT/JP2017/009754.

* cited by examiner

Fig.7
(a)
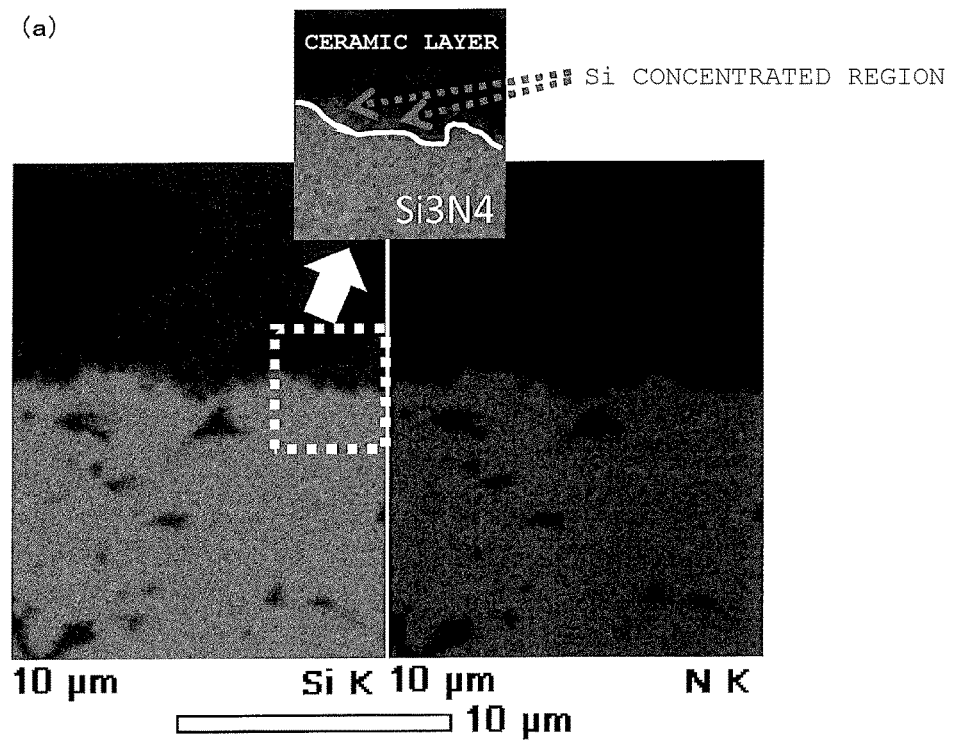
(b)
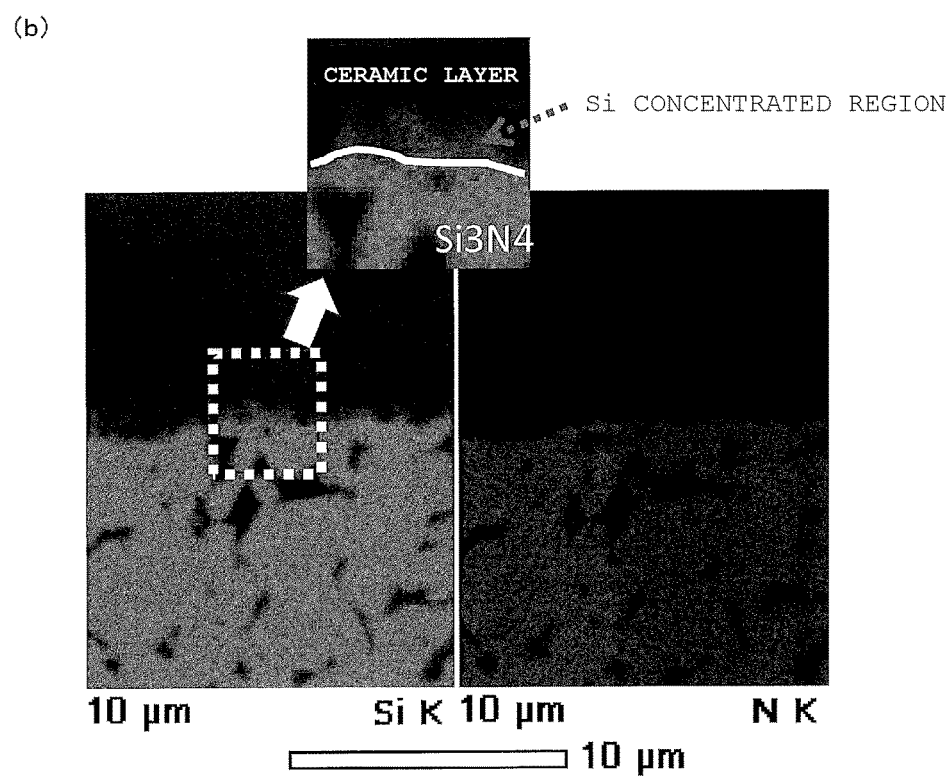

X01: ALL ARE CONTAINED, 900℃

X01: ALL ARE CONTAINED, 1000°C

Z01: NO Mn, 1000°C

Z02: NO Cu, 1000°C

Z03: NO B, 1000°C

CERAMIC SUBSTRATE AND PRODUCTION METHOD FOR SAME

CROSS REFERENCE TO RELATED APPLICATIONS

This application is a National Stage of International Application No. PCT/JP2017/009754, filed Mar. 10, 2017, claiming priority based on Japanese Patent Application No. 2016-069142, filed Mar. 30, 2016.

TECHNICAL FIELD

The present invention relates to a ceramic substrate used for mounting a semiconductor element or the like, and a method for producing the same.

BACKGROUND ART

A semiconductor integrated circuit device (hereinafter referred to as module) in which a semiconductor element is mounted on a ceramic substrate is used for various industrial equipment such as motors, in-vehicle equipment such as engine control units, home appliances such as refrigerators, air conditioners, and televisions, mobile communication equipment such as mobile phones and smart phones, and power supply circuits and amplifier circuits used for various electronic equipment.

Along with the recent miniaturization, thinning, and higher functionality of electronic equipment, miniaturization, thinning, and higher functionality are also similarly required for the module. In the semiconductor element, by higher integration of transistors caused by finer internal wirings, the withstand voltage of the transistors is reduced, and a consumption current is increased, whereby heat generation from the semiconductor element tends to be increased. Therefore, it is also required to efficiently diffuse the heat generation from the semiconductor element so as to stably operate the module.

Hitherto, modules having various structures for efficiently diffusing heat generation from a semiconductor element have been proposed. As an example thereof, a module is disclosed in Patent Document 1. In the basic structure of the module, a metal layer is formed on a plate-like ceramic substrate, and a metal layer is formed on the upper surface side of the ceramic substrate by a metallization method or the like. The ceramic substrate is a silicon nitride substrate having excellent thermal conductivity, and a heat sink is bonded to the lower surface side of the ceramic substrate. A semiconductor element is mounted on the metal layer and soldered.

Meanwhile, Patent Document 2 discloses an improvement in the function of a module, and an unfired green sheet made of low temperature co-fired ceramics (LTCC) is stacked on a sintered ceramic substrate to obtain a stacked product. The stacked product is fired to obtain a composite ceramic substrate. Electronic components such as a capacitor and an IC chip are mounted on the composite ceramic substrate to constitute the module.

PRIOR ART DOCUMENTS

Patent Documents

Patent Document 1: JP-A-9-97865
Patent Document 2: JP-A-2012-33664

SUMMARY OF THE INVENTION

Problems to be Solved by the Invention

Patent Document 2 describes the use of an alumina substrate as a ceramic substrate, and the previous blending of metal oxides such as copper oxide, cuprous oxide, zinc oxide, nickel oxide, bismuth oxide, silver oxide, and boron oxide with the green sheet in order to apply a chemical bonding function for bringing a green sheet into close contact with the alumina substrate.

However, it has been found that, when an unsintered green sheet made of low-temperature co-fired ceramic is stacked by using a silicon nitride substrate having more excellent thermal conductivity, mechanical strength, thermal shock resistance and the like than those of the alumina substrate as the ceramic substrate, the bonding property of the low-temperature co-fired ceramic material (LTCC material) used for the green sheet with the silicon nitride substrate is not obtained even if the LTCC material contains the metal oxide.

Accordingly, the object of the present invention is to focus on a silicon nitride substrate having high mechanical strength, high thermal conductivity and the like, and take advantage of such properties in order to provide: a ceramic substrate capable of providing an improvement in a bonding property between a silicon nitride substrate and a ceramic layer which uses a dielectric ceramic material capable of being simultaneously sintered with a low-resistance conductive material such as a low-melting metal (Ag or Cu); and a method for producing the ceramic substrate.

Means for Solving the Problems

As a result of intensive studies to solve the problems, the present inventors have found that the object can be achieved by adopting the following constitution, and completed the present invention. Various physical property values in the present invention are measured by a method adopted in Examples or the like.

That is, a ceramic substrate of the present invention is obtained by stacking and bonding a silicon nitride substrate and a ceramic layer composed of a dielectric ceramic material, wherein: the dielectric ceramic material contains Mg, Al, and Si as main ingredients, and Bi or B as an accessory ingredient; and the ceramic layer includes a region with a high Si element concentration at a bonding interface with the silicon nitride substrate.

In the present invention, it is considered that the region with a high Si element concentration is formed at the bonding interface between the silicon nitride substrate and the ceramic layer during sintering, to improve a bonding property. Although the detail of the mechanism of improving the bonding property is unknown, the mechanism is considered to be as follows. In the dielectric ceramic material, parent phase (composition mainly containing main ingredients) particles grow while producing adsorption between the particles, surface-diffuse, and grain boundary-diffuse so that sintering proceeds for densification. Meanwhile, a glass phase (a composition containing a part of the parent phase ingredients as the accessory ingredient) viscously flows between the parent phase particles. In the densification process during sintering, Si oxide of the glass phase exuded from between the parent phase particles easily oxidizes the surface of the silicon nitride substrate during the grain growth, whereby it is assumed that a part of the glass phase present between the parent phase particles is easily wet with the silicon nitride substrate, and any one of the following states occurs in sintering. (1) From the surface of the oxidized silicon nitride substrate, a Si ingredient derived from the silicon nitride substrate diffuses into the glass phase, and the Si oxide supersaturated in a cooling process diffuses toward the ceramic layer having a low Si concentration, to form a region with a high Si element concentration at the bonding interface, resulting in firm bonding between the glass phase and the silicon nitride substrate. (2) Si in the surface of the oxidized silicon nitride substrate and Si in the ceramic layer are firmly bonded via O, to form a region with a high Si element concentration at the bonding interface, resulting in firm bonding between the silicon nitride substrate and the ceramic layer. It is considered that at least one of (1) and (2) may act to form firm bonding. This is considered to take advantage of properties of the silicon nitride substrate such as high mechanical strength and high thermal conductivity, and be capable of providing an improvement in a bonding property between the silicon nitride substrate and the ceramic layer which uses the dielectric ceramic material capable of being simultaneously sintered with a low-resistance conductive material such as a low-melting metal (Ag or Cu).

The main ingredients of the dielectric ceramic material in the present invention preferably contain 10 to 25% by mass of Mg in terms of MgO, 15 to 46% by mass of Al in terms of $Al_2O_3$, and 40 to 65% by mass of Si in terms of $SiO_2$ based on 100% by mass of the main ingredients. The mass of the main ingredients is in such a range, which can provide a dielectric ceramic material containing cordierite. Cordierite (composition: $2MgO.2Al_2O_3.5SiO_2$) crystals may be deposited during firing (sintering) from oxides, carbonates and the like of Mg, Al, and Si, or a mixed powder of the accessory ingredient and cordierite powder may be calcined to obtain a calcined powder, which is fired. In either case, firm bonding with the silicon nitride substrate can be obtained. Since cordierite has a low dielectric constant and a low loss, it is useful as a ceramic substrate to be used at a microwave band frequency.

The accessory ingredient in the present invention preferably contains 0.1 to 10 parts by mass of Bi in terms of $Bi_2O_3$ or 0.1 to 10 parts by mass of B in terms of $B_2O_3$ based on 100 parts by mass of the main ingredients. The mass of the accessory ingredient is in such a range, which provides an effect of promoting low temperature sintering, or an effect of promoting the crystallization of cordierite during firing, whereby the structure can be densified even at low temperatures, and the bonding property can be improved. This is advantageous for obtaining the effects of the present invention.

It is preferable that the dielectric ceramic material further contains Cu as the accessory ingredient in the present invention, wherein the content of Cu is 0.1 to 10 parts by mass in terms of CuO based on 100 parts by mass of the main ingredients. When the dielectric ceramic material contains a predetermined amount of Cu, a Cu concentrated region with a high Cu concentration can be formed at the bonding interface, which is advantageous for firm bonding between the silicon nitride substrate and the ceramic layer.

It is preferable that the dielectric ceramic material further contains Mn as the accessory ingredient in the present invention, wherein the content of Mn is 0.1 to 10 parts by mass in terms of $Mn_3O_4$ based on 100 parts by mass of the main ingredients. When the dielectric ceramic material further contains Mn, vacancies (voids) in a bond part can be decreased, which provides an effect of promoting the crystallization of cordierite during firing. This allows the structure to be densified even at low temperatures, and allows the bonding property to be improved, which is advantageous for obtaining the effects of the present invention.

It is preferable that the dielectric ceramic material further contains a region with a high concentration of an element derived from the accessory ingredient in the vicinity of the region with a high Si element concentration in the present invention.

In the present invention, a wiring layer made of a low-melting metal may be formed on the ceramic substrate. It is preferable that the wiring layer is made of at least one selected from the group consisting of Ag, Au, Cu, an Ag alloy, and a Cu alloy. The use of a wiring material having low resistance makes it possible to reduce the transmission loss of a high power signal to achieve highly-efficient signal transmission.

In the present invention, it is preferable that a difference in thermal expansion coefficient between the silicon nitride substrate and the ceramic layer is within ±2 ppm/° C. This makes it possible to reduce the influence of thermal expansion during sintering, whereby a good adhesion state can be maintained without causing cracks to occur, which allows the bonding property to be further improved.

A method for producing a ceramic substrate of the present invention includes the steps of: forming a green sheet which contains a ceramic material containing Mg, Al, and Si as main ingredients and Bi or B as an accessory ingredient, and a binder; stacking at least one green sheet on a silicon nitride substrate to form a composite laminate; and firing the composite laminate at 1100° C. or lower to obtain a ceramic substrate in which the ceramic layer and the silicon nitride substrate are bonded to each other, wherein a region with a high Si element concentration is formed at a bonding interface between the ceramic layer and the silicon nitride substrate during the firing step. As described above, this makes it possible to produce a ceramic substrate having an improved bonding property between the ceramic layer and the silicon nitride substrate.

A method for producing a ceramic substrate of the present invention includes the steps of: applying a paste which contains a ceramic material containing Mg, Al, and Si as main ingredients, and Bi or B as an accessory ingredient, and a vehicle on a silicon nitride substrate, followed by drying to form a green layer, thereby forming a composite laminate; and firing the composite laminate at 1100° C. or lower to obtain a ceramic substrate in which a ceramic layer and the silicon nitride substrate are bonded to each other, wherein a region with a high Si element concentration is formed at a bonding interface between the ceramic layer and the silicon nitride substrate during the firing step. As described above, this makes it possible to produce a ceramic substrate having an improved bonding property between the ceramic layer and the silicon nitride substrate.

BRIEF DESCRIPTION OF THE DRAWINGS

FIG. 7 shows SEM-EDX mapping photographs of a Si element (left figure) and N element (right figure) in Example 2, wherein firing temperatures in (a) and (b) are respectively 900° C. and 1000° C.

MODE FOR CARRYING OUT THE INVENTION

A ceramic substrate of the present invention and a method for producing the same will be described below with reference to the drawings. However, in part or all of the drawings, parts unnecessary for explanation are omitted, and there are parts shown by magnification or reduction in order to facilitate explanation. Terms indicating a positional relationship such as upper and lower are used in order to merely facilitate explanation, and there is no intention to limit the configuration of the present invention at all.

<Ceramic Substrate>

Figure 1:
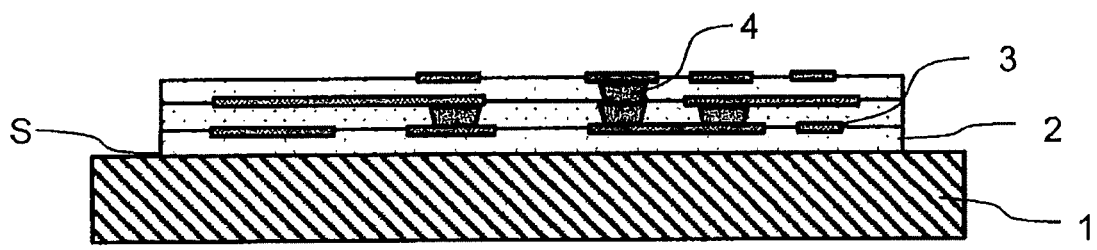
FIG. 1 is a schematic cross-sectional view of a ceramic substrate according to an embodiment of the present invention.

FIG. 1 is a schematic cross-sectional view of a ceramic substrate according to an embodiment of the present invention. In the ceramic substrate shown in FIG. 1, a silicon nitride substrate 1 and a ceramic layer 2 are stacked and bonded. In the illustrated example, the silicon nitride substrate 1 is larger than the ceramic layer 2, but the silicon nitride substrate 1 may have the same size as that of the ceramic layer 2. A wiring layer 3 is formed between the ceramic layers 2. The ceramic layer 2 and the wiring layer 3 each may be formed of one layer. A plurality of ceramic layers 2 and a plurality of wiring layers 3 may be stacked in this order to forma laminate. It is also possible to form a ceramic substrate in which the ceramic layer 2 and the wiring layer 3 are stacked in this order on each surface of the silicon nitride substrate 1. In order to form a necessary circuit, a connected through via 4 can also be formed in the ceramic layer 2. As will be described in detail later, by using a low-temperature co-fired ceramic material as the ceramic layer 2, a low-melting metal such as Ag or Cu can be used for the wiring layer 3 and a connected through via 4.

(Silicon Nitride Substrate)

In the present invention, a ceramic substrate for improving strength, a heat dissipation property, heat resistance and the like is called a core substrate, and a silicon nitride substrate having high mechanical strength and good thermal conductivity is used. As described above, the use of the silicon nitride substrate makes it possible to form a region with a high Si element concentration at a bonding interface with the ceramic layer during sintering, to firmly bond the silicon nitride substrate to the ceramic layer.

The silicon nitride substrate in the present invention is not particularly limited as long as it is a substrate mainly composed of a silicon nitride ($Si_3N_4$) ceramic material, and a commercially available product produced by a known method can be used as it is. Generally, the silicon nitride substrate can be produced by sintering in a nitrogen gas atmosphere at about 1800 to 2000° C. for 1 to 10 hours. The silicon nitride substrate can also be produced, for example, as disclosed in JP-A-2001-335368. In addition to the silicon nitride ($Si_3N_4$) ceramic material, the silicon nitride substrate may contain a sintering aid or the like for the purpose of enhancing strength, hardness, thermal stability, chemical stability and the like. Generally, $Y_2O_3$, $Al_2O_3$, MgO and the like can be used as the sintering aid or the like, but rare earth elements other than Y can also be used. From the viewpoint of sintering at low temperatures, it is preferable to use $Y_2O_3$, MgO and the like. $Y_2O_3$ and MgO are effective for densifying a structure to be obtained by sintering a silicon nitride raw material powder, and have small solid solubility in silicon nitride particles, whereby the thermal conductivity of the silicon nitride particles, and furthermore the thermal conductivity of a silicon nitride sintered body can be kept at a high level.

In the silicon nitride substrate of the present invention, the content of a silicon nitride ceramic material is preferably 70 to 99% by mass, and more preferably 85 to 99% by mass from the viewpoint of sufficiently developing strength. The content of an optional ingredient such as the sintering aid is preferably 0.1 to 10% by mass, and more preferably 0.5 to 6% by mass in terms of oxide from the viewpoint of providing low temperature sintering while densifying the structure.

It is generally known that the silicon nitride substrate in the present invention has a thermal expansion coefficient of 2.5 to 4 ppm/° C.

From the viewpoint of securing heat resistance and a heat dissipation property, the silicon nitride substrate in the present invention preferably has a thermal conductivity of 50 W/(m·K) or more, and more preferably 70 W/(m·K) or more.

From the viewpoint of securing strength, heat resistance and the like, the single layer thickness of the silicon nitride substrate is preferably 100 to 500 μm, and more preferably 200 to 300 μm. The silicon nitride substrate may be composed of one layer, but the silicon nitride substrate may also have a multilayer structure. In that case, the thickness of the multilayer structure is preferably in the above-described range from the viewpoint of making the ceramic substrate thin. In order to form a circuit necessary for the ceramic substrate, a connected through via can also be formed in the silicon nitride substrate.

A wiring layer may be provided on the surface of the silicon nitride substrate. In that case, it is preferable that the ceramic layer is bonded to a portion where the silicon nitride substrate is exposed. In that case, the wiring layer is not particularly limited as long as the wiring layer can be used for the silicon nitride substrate.

(Ceramic Layer)

A dielectric ceramic material constituting the ceramic layer in the present invention is composed of oxides of Mg, Al, and Si as main ingredients, and Bi or B as an accessory ingredient in order to improve the bonding property with the silicon nitride substrate. Therefore, it is considered that, when a green sheet or a ceramic material film (may also be referred to as green layer) which is a precursor of the ceramic layer, and a silicon nitride substrate are stacked, and then sintered, a Si concentrated region is formed as described above, whereby the silicon nitride substrate and the ceramic layer are firmly bonded to each other.

Figure 10:
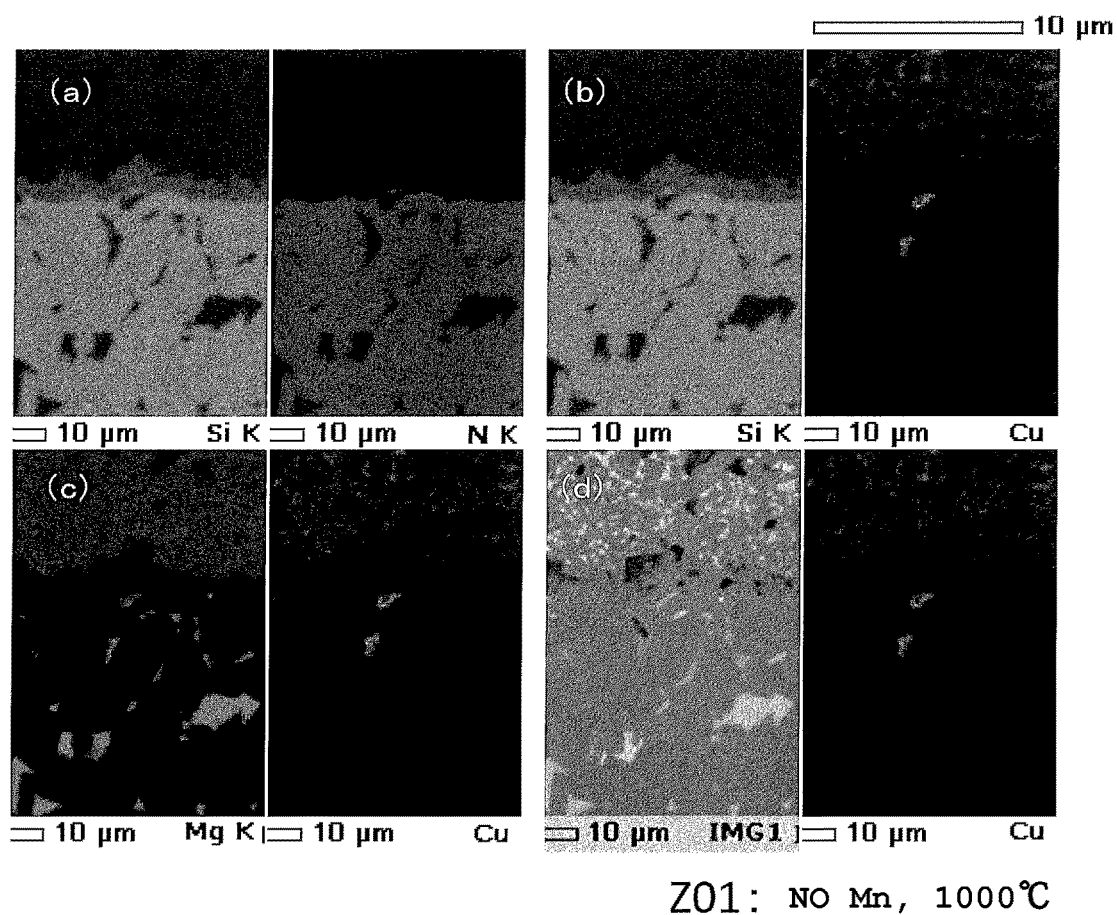
FIG. 10 is a SEM-EDX mapping photograph of Example 6 (1000° C.)
Figure 11:
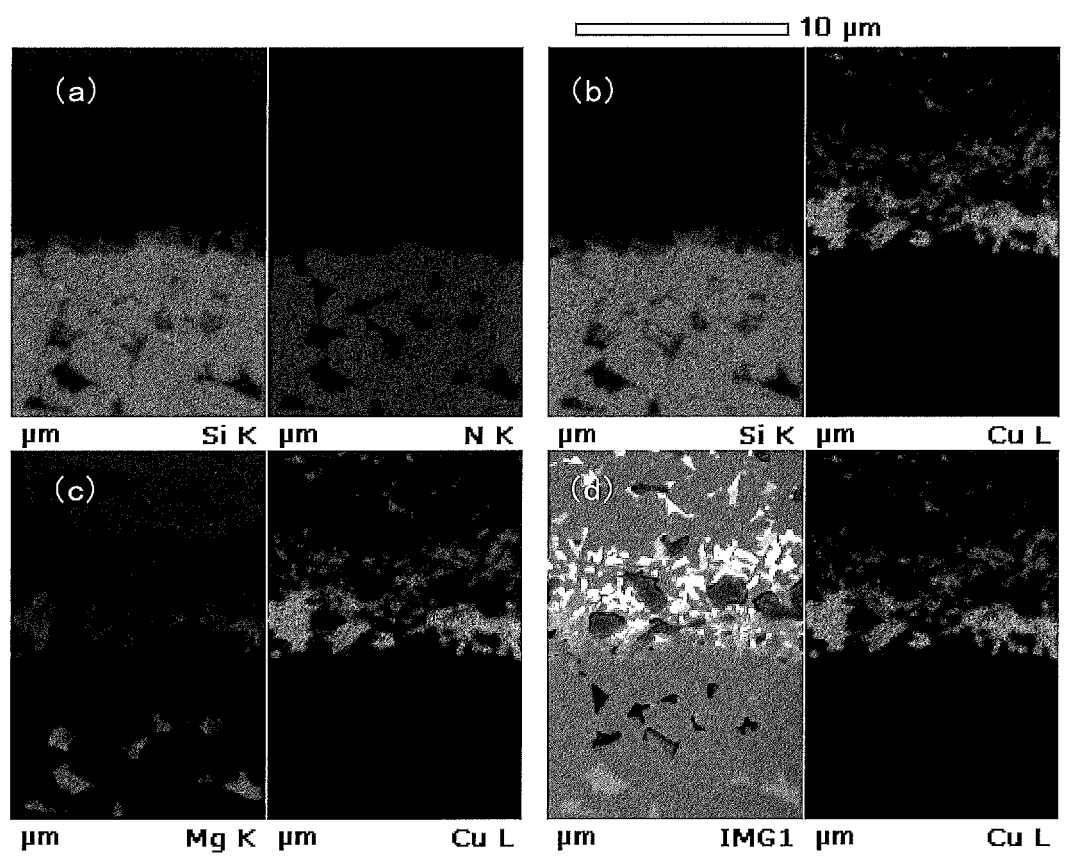
FIG. 11 is a SEM-EDX mapping photograph of Example 3 (1000° C.)
Figure 12:
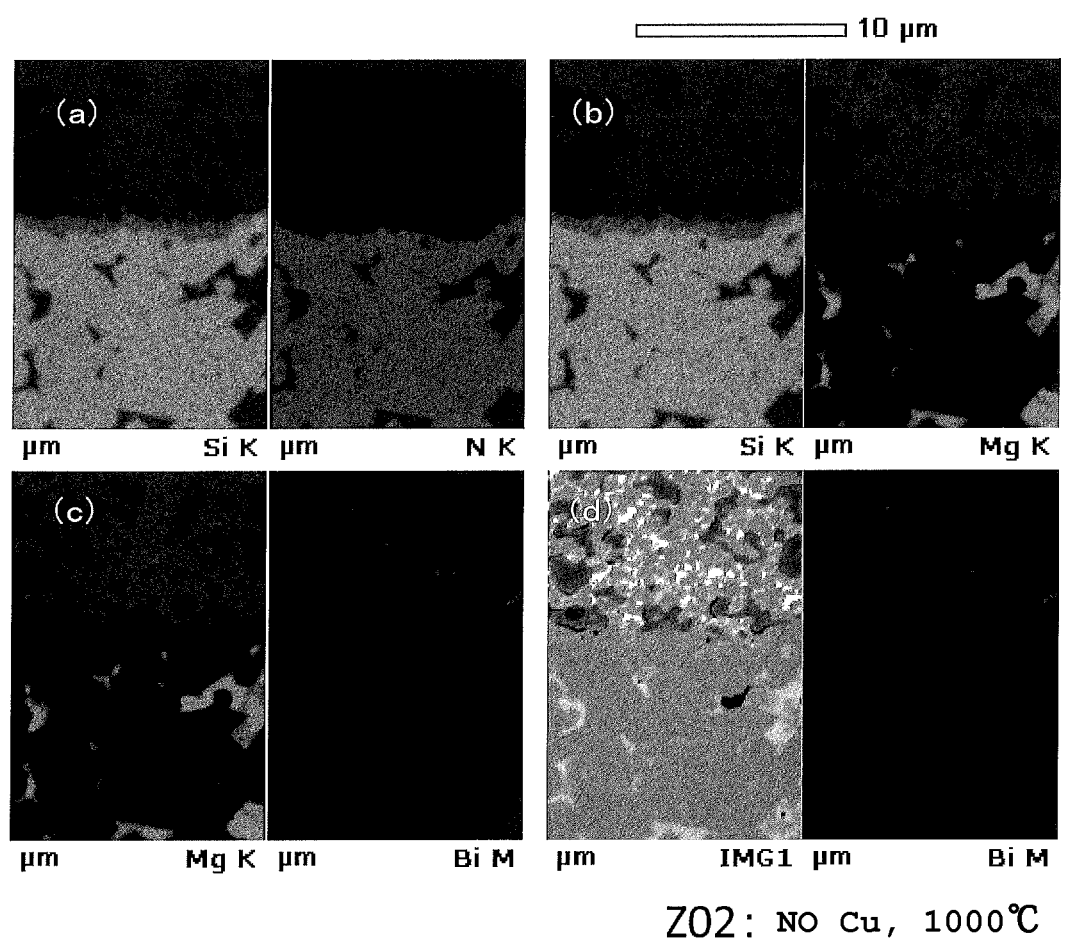
FIG. 12 is a SEM-EDX mapping photograph of Example 7 (1000° C.)
Figure 13:
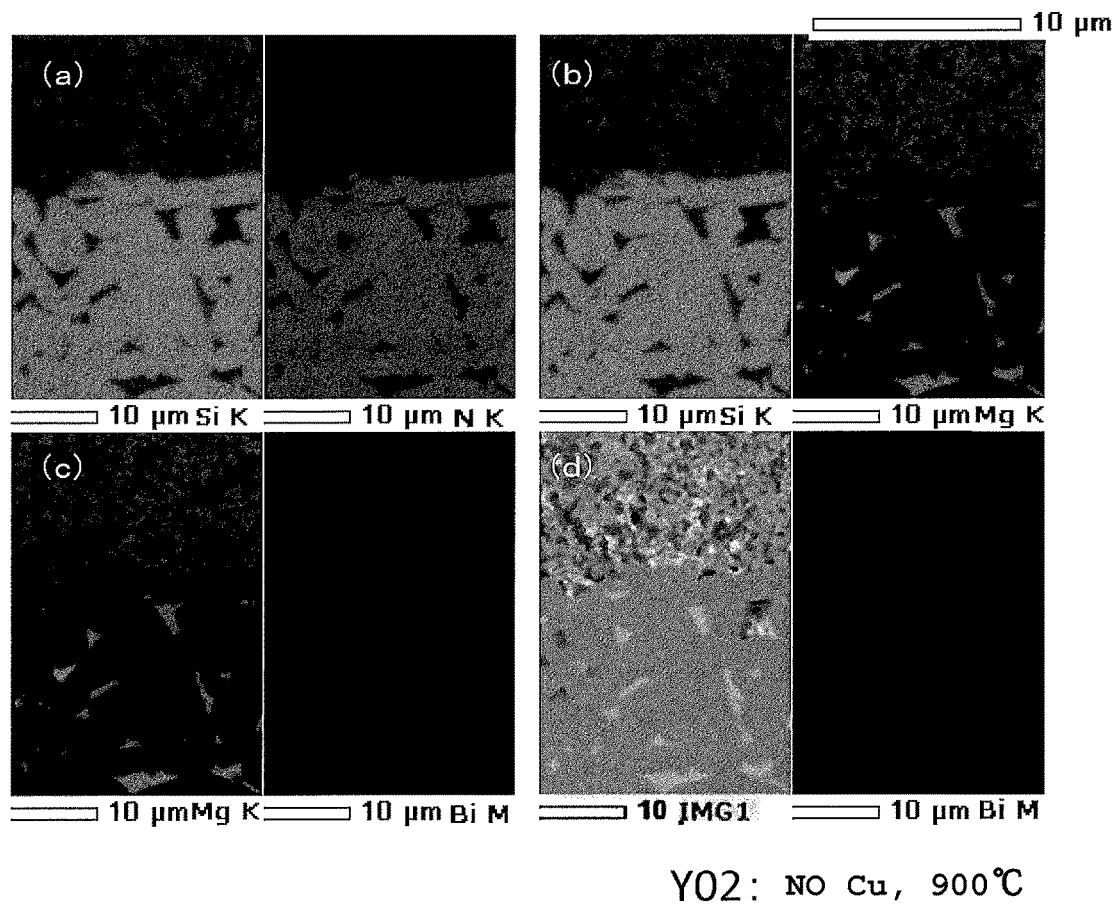
FIG. 13 is a SEM-EDX mapping photograph of Example 4 (900° C.)
Figure 14:
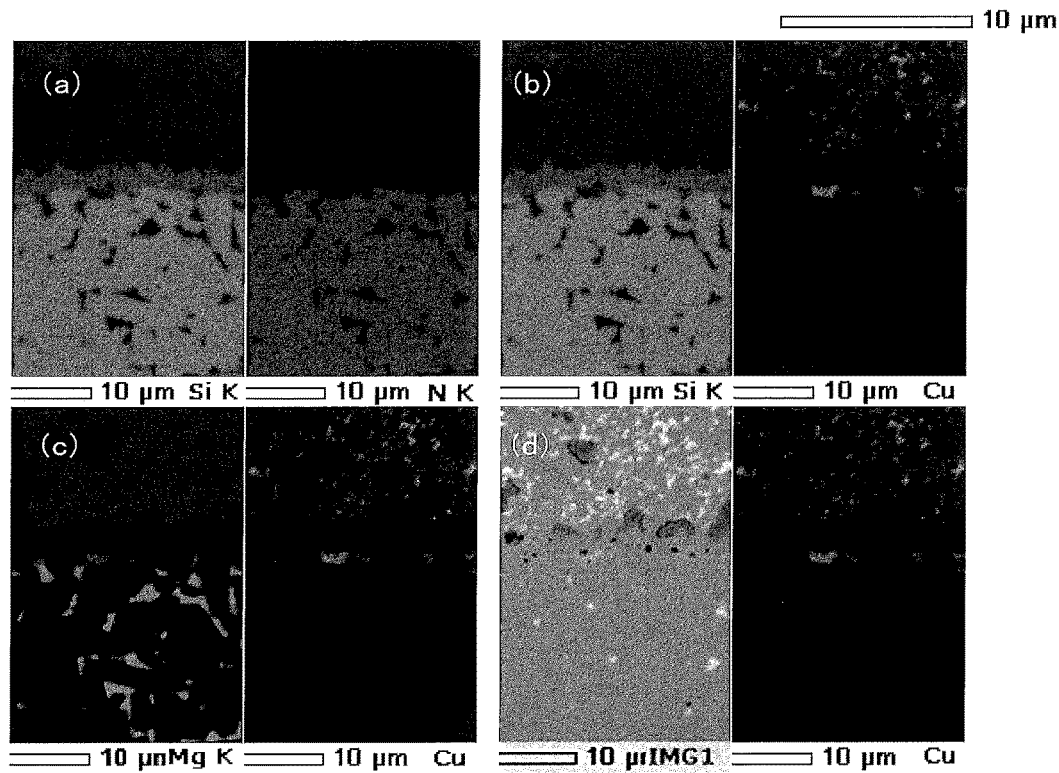
FIG. 14 is a SEM-EDX mapping photograph of Example 8 (1000° C.)

The ceramic layer in the present invention includes a region with a high Si element concentration at the bonding interface with the silicon nitride substrate. Here, the region with a high Si element concentration will be described. Detailed measurement conditions are as described below. However, at the bonding interface between the silicon nitride substrate and the ceramic layer, the presence or absence of a N element is examined by an energy dispersive X-ray analyzer (EDX), and the boundary of the presence or absence of the N element is taken as the boundary of the bonding interface between the silicon nitride substrate and the ceramic layer. The region with a high Si element concentration means a region located on a ceramic layer side with respect to the bonding interface and including a higher Si element concentration than that in the other region of the ceramic layer. This region may be distinguishable as a layer (see FIG. 10(a) or the like). Herein, the region with a high Si element concentration may also be referred to as Si concentrated region. Herein, "region" is used in the same sense for each element other than Si element.

From the viewpoint of improving the bonding property, the thickness of the region with a high Si element concentration from the bonding interface is preferably 5 μm or less, and more preferably 1 μm or less. Here, the thickness of the region with a high Si element concentration from the bonding interface is obtained by randomly selecting five boundaries of 10 μm from a plurality of Si element mapping microphotographs of the EDX, and averaging the maximum thicknesses (sizes) of a Si element high region in a stacking direction from the bonding interface at the selected five boundaries. When the region can be distinguished as a layer, the average thickness of the ceramic layer is preferably 5 μm or less, and more preferably 1 μm or less. From the viewpoint of improving the bonding property, it is preferable that the Si element high region is layered.

The dielectric ceramic material constituting the ceramic layer in the present invention is composed of Mg, Al, and Si as main ingredients, and is preferably composed of oxides of Mg, Al, and Si. In particular, the Si ingredient constitutes cordierite, is contained in a glass phase contributing to densification during sintering, and contributes to the bonding property with the silicon nitride substrate. Although the segregation of the Al ingredient in the vicinity of the bonding interface is not observed, the Mg ingredient may form a Mg concentrated region at the bonding interface depending on a method for producing an LTCC material used for the green sheet, and segregate with Si at the interface to be involved in the bonding property.

In the present invention, the LTCC material can be used as the ceramic material used for the dielectric ceramic material. Here, the case where the LTCC material is used in the present invention will be briefly described.

The LTCC material has roughly three aspects. In the first aspect, the oxide or carbonate of the main ingredients and accessory ingredient may be used, mixed, and calcined to provide an LTCC material having cordierite (typically, $2MgO.2Al_2O_3.5SiO_2$) as a main phase and a vitrified portion as a part of the other. In the second aspect, the oxides or carbonates of the main ingredients may be used, mixed, and calcined to provide one obtained by adding the oxide or carbonate of the accessory ingredient with a powder containing $Al_2O_3$ and a glass phase as a main phase. In the third aspect, a powder of cordierite (typically $2MgO.2Al_2O_3.5SiO_2$) as the main phase of the dielectric ceramic material, and the oxide or carbonate as the accessory ingredient may be used, and mixed. The glass phase contributes to the densification of the LTCC material of any aspect during sintering, but in the third aspect, the composition of the glass phase is considered to be different from the other aspects. In the first and second aspects, it is believed that the accessory ingredient is solid-solved in cordierite during the firing process, whereas in the third aspect, cordierite is already present, which is less likely to provide solid solution formation. Therefore, it is predicted that the amount of the accessory ingredient in the glass phase in the third aspect is larger, as a result of which the glass phase has a lower melting point than those in the other aspects.

It is preferable that the ceramic layer further contains a region with a high concentration of an element derived from the accessory ingredient in the vicinity of the region with a high Si element concentration in the present invention. The region with a high concentration of an element derived from the accessory ingredient may be coincident with the region with a high Si element concentration. However, under the influence of the composition or the like in the glass phase, the region with a high Si element concentration may be contained, and spread.

It is preferable that, when the total amount of the main ingredients of the dielectric ceramic material is 100% by mass, the main ingredients of the dielectric ceramic material contain 10 to 25% by mass of Mg in terms of MgO, 15 to 46% by mass of Al in terms of $Al_2O_3$, and 40 to 65% by mass of Si in terms of $SiO_2$. If the main ingredients are in such ranges, the dielectric ceramic material containing cordierite can be obtained. Since cordierite has a low dielectric constant and a low loss, it is useful as a ceramic substrate to be used at a microwave band frequency. In the first and second aspects of the LTCC material, cordierite (composition: $2MgO.2Al_2O_3.5SiO_2$) crystals can be deposited from the LTCC material at low temperatures during firing.

From the viewpoint of improving the bonding property, the dielectric characteristics and the like, the dielectric ceramic material preferably contains 10 to 25% by mass of Mg in terms of MgO, and more preferably 10 to 20% by mass of Mg when the total amount of the main ingredients is 100% by mass.

If the LTCC material is adjusted so as to fall within this range, the ratio of cordierite ($2MgO.2Al_2O_3.5SiO_2$) crystals deposited during firing is increased at low temperature firing (for example, 1000° C. or less), which is likely to provide a low relative permittivity, a low dielectric loss and the like. If the amount of Mg in terms of MgO exceeds 25% by mass, the deposition amount of enstatite ($MgO.SiO_2$) (εr 6.5) having a high relative permittivity is increased, which may be less likely to provide a low relative permittivity.

From the viewpoint of improving the dielectric characteristics, the dielectric ceramic material preferably contains 15 to 46% by mass of Al in terms of $Al_2O_3$, and more preferably 25 to 40% by mass of Al when the total amount of the main ingredients is 100% by mass. This range provides a high ratio of cordierite ($2MgO.2Al_2O_3.5SiO_2$)

crystals in the dielectric ceramic material obtained in low temperature firing (for example, 1000° C. or less), which is likely to provide a low relative permittivity, a low dielectric loss and the like.

From the viewpoints of improving the bonding property, the dielectric characteristics and the like, the dielectric ceramic material constituting the ceramic layer preferably contains 40 to 65% by mass of Si in terms of $SiO_2$, and more preferably 43 to 65% by mass of Si when the total amount of the main ingredients is 100% by mass. This range provides a high ratio of cordierite ($2MgO.2Al_2O_3.5SiO_2$) crystals at low temperature firing (for example, 1000° C. or less), which is likely to provide a low relative permittivity, a dielectric loss and the like.

Even when the contents of MgO, $Al_2O_3$, and $SiO_2$ are in the above-mentioned range, enstatite ($MgO.SiO_2$) crystals, spinel ($MgO.Al_2O_3$) crystals, and $SiO_2$ crystals may be deposited in addition to the cordierite crystals. However, the deposition amount is a trace amount, whereby the effects of the present invention are not impaired.

Next, the accessory ingredient of the dielectric ceramic material constituting the ceramic layer will be described. The dielectric ceramic material in the present invention contains Bi or B as the accessory ingredient, and preferably contains Bi and B from the viewpoints of the bonding property with the silicon nitride substrate and the densification of the dielectric ceramic material. Bi or B is indispensable as the accessory ingredient, and Cu, Mn, Zn and the like can be added as an optional ingredient. From the viewpoint of improving the bonding property, Cu and Mn are preferably added. Depending on the method for producing the LTCC material, the Bi and Cu ingredients may form the concentrated region of each element at the bonding interface, and segregate at the interface together with the Si concentrated region to be involved in the bonding property.

B has an effect of promoting low temperature sintering since B forms a liquid phase during sintering, and is preferably added in order to obtain a bonding interface having firm bonding. From the viewpoint of providing a dense structure sufficiently sintered at low temperature firing (for example, 1000° C. or less) to obtain a low-loss dielectric ceramic material, the amount of B in terms of $B_2O_3$ is preferably 0.1 to 10 parts by mass, more preferably 1 to 7 parts by mass, and still more preferably 1 to 5 parts by mass when the total amount of the main ingredients is 100 parts by mass.

As with the case of B, Bi is preferably added in order to promote low-temperature sintering and to obtain the bonding interface having firm bonding. It is considered that, since Bi promotes the sintering of the LTCC material, vacancies (voids) at the bonding interface with the silicon nitride substrate are decreased to enhance the reliability of bonding, whereby the bonding property is strengthened. From the viewpoint of improving the dielectric characteristics, the amount of Bi is preferably 0.1 to 10 parts by mass in terms of $Bi_2O_3$, and more preferably 1 to 8 parts by mass when the total amount of the main ingredients is 100 parts by mass. Depending on the method for producing the LTCC material, Bi includes a Bi concentrated region in the vicinity of the bonding interface, but the amount of Bi near the interface may be small.

The weight ratio ($B_2O_3/Bi_2O_3$) of $B_2O_3$ and $Bi_2O_3$ is preferably 0.2 to 0.8, and more preferably 0.35 to 0.75. During firing at the same temperature (for example, during firing at 900° C.), densification is less likely to be provided as the amount of B is smaller. However, if the Bi amount is set such that such a ratio is obtained, the structure of the dielectric ceramic material can be densified, whereby a desired sintered density can be obtained.

Cu has an effect of promoting low temperature sintering and an effect of promoting the crystallization of cordierite during firing. The amount of Cu is preferably 0.1 to 10 parts by mass in terms of CuO, more preferably 1.0 to 8 parts by mass, and still more preferably 2.5 to 7 parts by mass when the total amount of the main ingredients is 100 parts by mass. If the amount of Cu is less than 0.1 part by mass, the effect of promoting low temperature sintering cannot be obtained. If the amount of Cu is more than 10 parts by mass, excessive Cu oxide may segregate at the bonding interface with the silicon nitride substrate to lower the bonding strength. If the amount of Cu is a preferable composition amount, a Cu concentrated region may be formed adjacent to the Si concentrated region depending on the method for producing the LTCC material, and segregate at the interface to be involved in the bonding property. Furthermore, depending on the method for producing the LTCC material, Cu may form a Cu concentrated region at the bonding interface, and segregate at the interface together with a Mg concentrated region to be involved in the bonding property.

Mn also has an effect of promoting low temperature sintering and an effect of promoting the crystallization of cordierite during firing. The amount of Mn is preferably 0 to 10 parts by mass in terms of $Mn_3O_4$, more preferably 0.1 to 10 parts by mass, and still more preferably 0.1 to 5 parts by mass when the total amount of the main ingredients is 100 parts by mass.

The weight ratio ($Mn_3O_4/CuO$) of $Mn_3O_4$ and CuO is preferably 0.1 to 3.5, and more preferably 0.1 to 2.0. As the amount of CuO is increased, firing is likely to proceed (cordierite formation proceeds). Such a ratio is likely to provide desired dielectric characteristics (for example, fQ value).

Zn has an effect of promoting low temperature sintering and an effect of reducing the relative permittivity. The amount of Zn is desirably 0 to 2.5 parts by mass in terms of ZnO when the total amount of the main ingredients is 100 parts by mass.

From the viewpoint of preventing crack generation during sintering, a difference in thermal expansion coefficient between the ceramic layer in the present invention and the silicon nitride substrate is preferably within ±2 ppm/° C., and more preferably within ±1 ppm/° C. Still more preferably, the thermal expansion coefficient of the ceramic layer is substantially the same as that of the silicon nitride substrate. That is, when the thermal expansion coefficient of the silicon nitride substrate is 3 ppm/° C., the thermal expansion coefficient of the ceramic layer is preferably 1 to 5 ppm/° C., and more preferably 2 to 4 ppm/° C. when the ceramic layer is bonded to the silicon nitride substrate, for example, at an area of 5 mm×5 mm or more.

The single layer thickness of the ceramic layer is preferably selected 20 to 400 μm, and more preferably 50 to 300 μm from the viewpoint of securing strength, an insulating property and the like. Although the ceramic layer may be composed of one layer, the ceramic layer may have a multilayer structure. In that case, the total thickness of the multilayer structure is preferably in the range of 20 to 400 μm, and more preferably 50 to 300 μm as described above in order to make the ceramic substrate thin.

Raw materials of the dielectric ceramic material forming the ceramic layer are provided as oxides or carbonates of ingredients, or the like, and may be optionally combined within the ranges of the main ingredients and accessory ingredient. The dielectric ceramic material can contain impurities (inevitable impurities) derived from the raw materials. As described above, the LTCC material used for the ceramic layer has three aspects, and a commercially available product produced by a known method can be used for the main phase of the dielectric ceramic material. However, the LTCC material can also be obtained by calcining a powder obtained by weighing and mixing raw materials to obtain a mixture, and drying the mixture. As a mixing method, a known mixing method can be used. From the viewpoint of uniformity, for example, the raw materials and ion-exchanged water are preferably charged into a ball mill including zirconia balls each having a diameter of 5 mm, and wet-mixed for 10 to 40 hours to form a slurry. From the viewpoint of production efficiency, the concentration of the slurry during mixing is preferably 20 to 50% by mass. A known method can be used as the calcination. For example, it is preferable that, in the air in a firing furnace, a temperature is increased at a rate of temperature increase of 100 to 300° C./hr, and the temperature is held at 1000° C. to 1150° C. for 1 to 3 hours. In the case of the above-mentioned first aspect in which cordierite is deposited as the main phase during the calcination, the calcining temperature is preferably 1000° C. to 1100° C. In the case of the second aspect in which $Al_2O_3$ and the glass phase are deposited as the main phase during the calcination, the calcining temperature is more preferably 1050° C. to 1150° C.

In the above-mentioned third aspect, a commercially available cordierite materials can also be used. The cordierite material is not particularly limited, and both a natural product and a synthetic product can be used. Commercially available products produced by known methods may be used as they are. Typically, the cordierite material is silicate mineral cordierite represented by a composition of $2MgO.2Al_2O_3.5SiO_2$. The cordierite material preferably has a chemical composition of 42 to 56% by mass of $SiO_2$, 30 to 45% by mass of $Al_2O_3$, and 12 to 16% by mass of MgO, and can contain excessive MgO, $Al_2O_3$, or $SiO_2$ with respect to the stoichiometric composition of cordierite. The cordierite material can contain impurities derived from raw materials (unavoidable impurities).

In the above-mentioned third aspect, a cordierite material can also be used, which is obtained by blending raw material powders respectively containing Si, Al, and Mg, to obtain a blended product, firing the blended product at 1300° C. to 1400° C. according to a known method, and finely pulverizing the fired product according to pulverization. The pulverization may be performed by a wet method or a dry method, and a well-known pulverization method can be used.

The purity of the cordierite material is preferably 95% by mass or more, and more preferably 97% by mass or more from the viewpoint that the dielectric characteristics can be improved.

From the viewpoint of densifying the structure during sintering, the cordierite material preferably has a BET specific surface area of 8 $m^2$/g or more, and more preferably 12 $m^2$/g or more. The upper limit value is not particularly limited, and the upper limit value is preferably 25 $m^2$/g or less.

The relative permittivity of the cordierite material is preferably 5.5 or less (15 GHz) in order to achieve intended dielectric characteristics. The relative permittivity can also be adjusted depending on the ratio of cordierite occupied in the ceramic layer.

(Wiring Layer)

In the present invention, the ceramic layer may have a wiring layer. The wiring layer can be formed using a known conductive paste, but the wiring layer is preferably made of at least one selected from the group consisting of Ag, Au, Cu, an Ag alloy, and a Cu alloy. The use of a wiring material having low resistance makes it possible to achieve the low loss of signal transmission in a transmission line.

The thickness of the wiring layer is preferably 20 to 300 μm, and more preferably 50 to 100 μm from the viewpoint of achieving the low loss of the signal transmission. A preferable value can be selected according to the voltage and current of the signal to be transmitted.

<Method for Producing Ceramic Substrate>

A method for producing a ceramic substrate of the present invention includes the steps of: forming a green sheet which contains a ceramic material containing Mg, Al, and Si as main ingredients and Bi or B as an accessory ingredient, and a binder; stacking at least one green sheet on a silicon nitride substrate to form a composite laminate; and firing the composite laminate at 1100° C. or lower to obtain a ceramic substrate in which a ceramic layer and the silicon nitride substrate are bonded to each other. In the ceramic substrate obtained through the firing step, the silicon nitride substrate and the ceramic layer are stacked and bonded to each other. The ceramic layer may include a region with a high Si element concentration formed at a bonding interface with the silicon nitride substrate. Thus, as described above, it is possible to produce a ceramic substrate having an improved bonding property between the ceramic layer and the silicon nitride substrate. The composite laminate can be fired in a temperature range between about 900° C. to a silver melting point (961° C.) and about 1000° C. to a copper melting point (1083° C.). For forming the green sheet, a known sheet forming method such as a doctor blade method can be adopted.

For the ceramic material, an LTCC material can be used. When the LTCC material is used, a green sheet which contains an LTCC material containing Mg, Al, and Si as main ingredients and Bi or B as an accessory ingredient, and a binder is first formed. The detail of the LTCC material is as described above. The binder is not particularly limited as long as the binder is conventionally known, and examples of the binder include polyvinyl butyral (PVB), polyvinyl alcohol (PVA), and an acrylic binder from the viewpoints of the strength, drilling property, pressure-bonding property, and dimensional stability of the green sheet obtained by sheet forming. The binder is preferably added in an amount of 5 to 25 parts by weight based on 100 parts by weight of the slurry. As a solvent, an organic solvent such as ethanol, butanol, toluene, or isopropyl alcohol is preferably used. By mixing the raw materials in a ball mill or the like, the slurry can be dispersed. In order to improve the uniformity of the slurry, a dispersant or the like may also be added as necessary.

The green sheet can be supported on a resin film made of PET or the like. In this state, a via hole can be formed in the green sheet. In order to form the via hole, a known method can be used, and the via hole can be formed by punching using a punching mold including a plurality of punching pins, or by laser processing, for example. Depending on the application of the ceramic substrate, the size of the via hole can be selected, for example, according to the magnitude of electric power transmitted through a line on the ceramic substrate. The diameter of the via hole is preferably set to 30 to 400 μm by the punching mold or the laser processing.

Next, a wiring pattern is preferably formed on the green sheet using a conductive paste. The green sheet and a screen mask are set in a printing machine. The conductive paste can be printed and filled in the via hole formed in the green sheet using a squeegee, and the wiring pattern or the like can be printed and formed. As the conductive paste, a known conductive paste can be used, and from the viewpoint of low resistivity, for example, a paste made of Ag, Cu or the like can be used.

It is possible to peel off a resin film from the green sheet on which the wiring pattern is formed, and stack a green sheet on which a plurality of patterns are formed. A laminate having a thickness of 0.2 to 1.5 mm can be obtained by stacking 5 to 20 green sheets on which the patterns are formed, and the green sheets each have a thickness of 10 to 200 µm. The number of the sheets to be stacked (stack number) or the like can be optionally selected according to the intended thickness as the ceramic substrate. When the green sheets are stacked, a pressure can be applied in a vertical direction in a state where the green sheet is fixed to a press machine with an adhesive sheet, and the other green sheet is disposed so that via wiring parts overlap with each other. In this step, the green sheets can be pressure-bonded at a temperature at which the binder softens, for example, at 60 to 90° C. for 100 seconds to 30 minutes with a pressure of 1 to 50 MPa being applied.

A pressure can be applied in a vertical direction in a state where the laminate in which the plurality of green sheets are stacked is superposed on the silicon nitride substrate. Also in this step, a composite laminate is preferably obtained, in which the green sheet on which at least a wiring pattern is formed is pressure-bonded and stacked on the silicon nitride substrate at a temperature at which the binder of the green sheet softens, for example, at 60 to 90° C. for 100 seconds to 30 minutes with the pressure of 1 to 50 MPa being applied. The green sheet before the wiring pattern is formed can also be pressure-bonded and stacked.

Thereafter, the composite laminate is fired at 1100° C. or lower (firing step) to form the ceramic substrate in which the ceramic layer and the silicon nitride substrate are bonded to each other. This firing depends on the type of the conductive paste, and can be performed in a state where a temperature of 850° C. to 1100° C. is held for about 30 minutes to 5 hours, for example, in the air or a $N_2$ atmosphere. A degreasing step of removing the binder of the green sheet is preferably performed before the firing step. In the degreasing step, in order to facilitate the diffusion of a gas generated by debinding and to prevent the delamination of the green sheet due to the pressure of the generated gas, in a temperature region from about 200° C. which is the thermal decomposition initiation temperature of the binder to about 750° C. which is the thermal decomposition completion temperature, or particularly in a temperature region where the thermal decomposition reaction is notable, it is desirable to increase the temperature at a rate of 20° C. or less per hour. Although the debinding is possible even in the nitrogen atmosphere, it is preferable to supply and evacuate sufficient air, nitrogen or the like in order to promote the decomposition/oxidation of an organic binder and to promote the removal of the generated decomposed gas or $CO_2$ gas. An atmosphere mixed with water vapor for the purpose of promoting the thermal decomposition may be used. During the firing step, the region with a high Si element concentration is formed at the bonding interface between the ceramic layer and the silicon nitride substrate.

As described above, the plurality of green sheets can be stacked to form the composite laminate, and the composite laminate is then fired to produce the ceramic substrate in which the ceramic layer and the silicon nitride substrate are bonded to each other. However, the method may include the step of applying a paste which contains a ceramic material containing Mg, Al, and Si as main ingredients and Bi or B as an accessory ingredient, and a vehicle on a silicon nitride substrate, followed by drying to form a green layer, thereby producing a composite laminate, and the step of firing the composite laminate at 1100° C. or lower to produce a ceramic substrate in which the ceramic layer and the silicon nitride substrate are bonded to each other, wherein, in the firing step, the region with a high Si element concentration can be formed at a bonding interface between the ceramic layer and the silicon nitride substrate. Such a printing process makes it possible to directly form the green layer on the silicon nitride substrate without peeling off a carrier film.

As the paste containing a vehicle, for example, a paste can be formed by mixing and calcining the raw materials of the LTCC material as described above, followed by pulverizing in a ball mill or the like, and drying to obtain a dried product, and adding a vehicle containing butyl carbitol acetate (BCA), ethyl cellulose (EC) or the like to the dried product. Conditions for mixing, calcination, pulverization, drying and the like are preferably as described above. In order to apply the paste, a known printing method can be used. The green layer, the wiring pattern and the like can be alternately printed and stacked. After applying, drying can be performed by a known method, and the green layer is preferably obtained by drying at about 30 to 100° C. for about 1 to 5 hours. As the other conditions, the above-mentioned conditions can be appropriately used.

The obtained ceramic substrate uses the silicon nitride substrate having high mechanical strength as the core substrate, whereby the mechanical strength can be reinforced as compared with the case where the ceramic substrate is composed only of the ceramic layer having relatively low mechanical strength.

The obtained ceramic substrate uses the silicon nitride substrate having good thermal conductivity as the core substrate, whereby the ceramic substrate has an excellent heat dissipation property as compared with the case where the ceramic substrate is composed only of the ceramic layer having relatively poor thermal conductivity. Furthermore, the obtained ceramic substrate includes the stacked ceramic layers having good dielectric characteristics, whereby a plurality of circuit elements, wirings and the like can be formed in the ceramic layers, which makes it possible to miniaturize the module using the ceramic substrate.

In addition to the structure in which the ceramic layer is reinforced by the silicon nitride substrate, the obtained ceramic substrate can have a module structure in which a part of the silicon nitride substrate is used for a high power circuit, and a small signal circuit is formed in the ceramic layer bonded to the other portion. In the latter case, for example, a power element, a heat dissipation block and the like are mounted on apart of the silicon nitride substrate, and an IC, a small signal circuit element and the like are mounted on the bonded ceramic layer.

Hereinafter, a method for producing a ceramic substrate of the present invention will be described according to a specific producing flow, but the present invention is not limited by the producing flow thereof.

Figure 2:
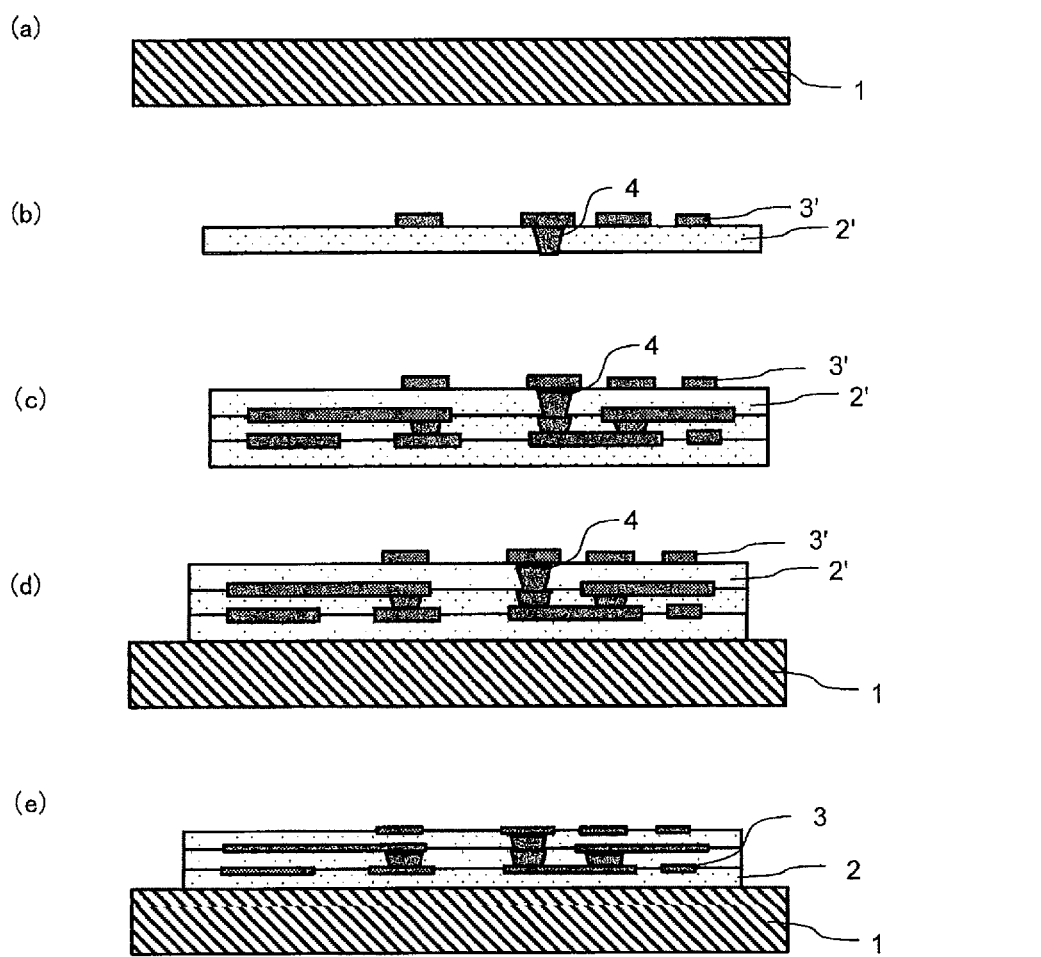
FIG. 2 shows a producing flow of a ceramic substrate according to an embodiment of the present invention.
Figure 3:
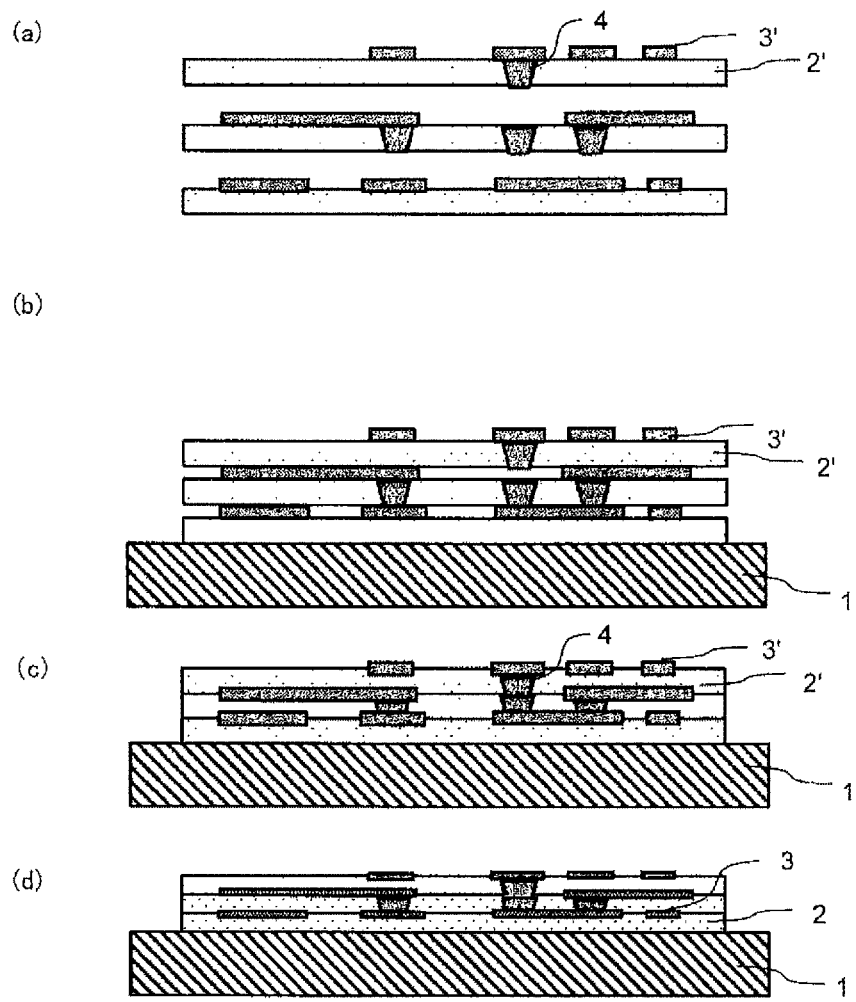
FIG. 3 shows a producing flow of a ceramic substrate according to another embodiment of the present invention.
Figure 4:
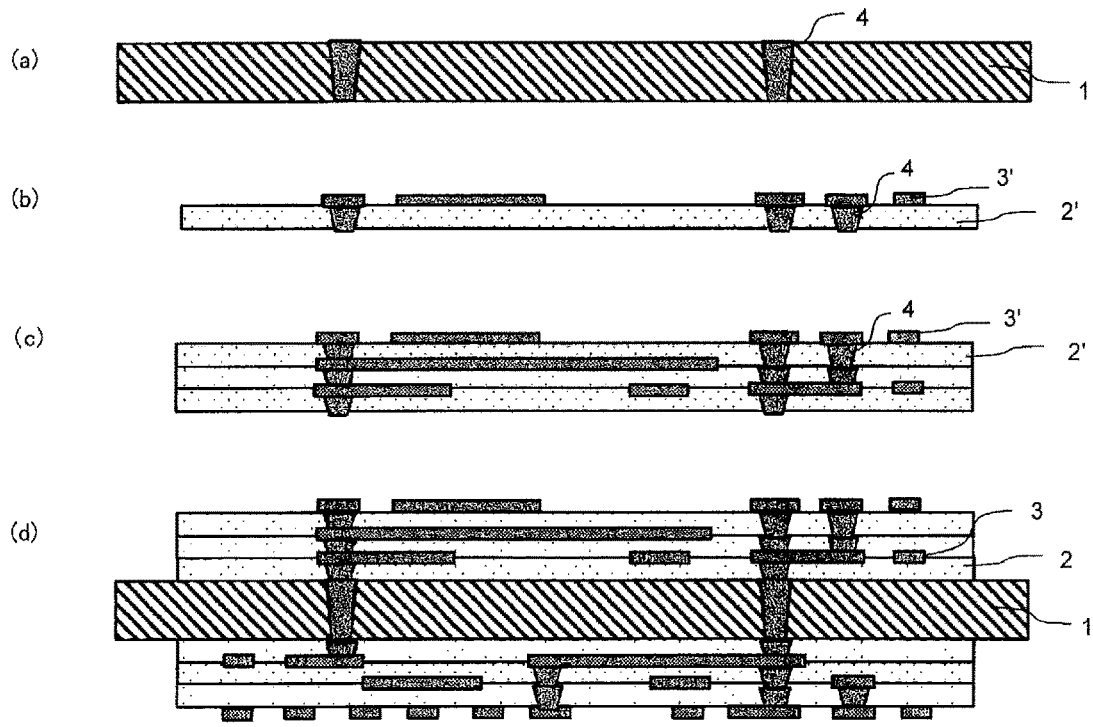
FIG. 4 shows a producing flow of a ceramic substrate according to another embodiment of the present invention.

FIGS. 2 to 4 show a producing flow of a ceramic substrate according to an embodiment of the present invention. In any case, a ceramic layer is formed of a green sheet.

FIG. 2 shows a producing flow of a ceramic substrate according to an embodiment of the present invention.

(a) First, as a silicon nitride substrate 1 used for the present ceramic substrate, a sintered substrate can be used as it is. If necessary, the surface of the silicon nitride substrate to be used may be polished.

(b) Next, when an LTCC material is used as a ceramic material in the present invention, a green sheet is formed, and a via 4 is then formed so that a necessary circuit can be formed. The via 4 is filled with a conductive paste, and a wiring pattern 3' is printed on the surface of a green sheet 2' to produce a layer constituting a laminate.

(c) Next, the plurality of green sheets 2' produced in the step (b) are stacked, heated, and pressurized to produce an integrated laminate.

(d) Next, the laminate produced in the step (c) is heated, and pressurized on the silicon nitride substrate 1 produced in the step (a), thereby producing an integrated composite laminate. The laminate can also be integrated not only on one main surface of the silicon nitride substrate 1 but also on each of both the surfaces. The green sheets produced in the step (b) can be sequentially stacked and fixed on the silicon nitride substrate 1 produced in the step (a), followed by heating and pressurizing, thereby integrating them.

(e) Finally, the composite laminate of the laminate produced in the step (d) and the silicon nitride substrate 1 is fired in at 850° C. to 1000° C. a firing furnace, whereby the silicon nitride substrate 1 and the ceramic layer 2 are bonded to each other, which makes it possible to produce a composite ceramic substrate having a wiring layer 3. In the firing step, the green sheet is restrained in sintering shrinkage in the in-plane direction of the silicon nitride substrate 1, and sintered and shrunk only in the thickness direction, to provide the densified green sheet.

As another producing flow, FIG. 3 shows a producing flow of a ceramic substrate according to another embodiment of the present invention.

(a) First, a green sheet is formed from an LTCC material according to the present invention, and a wiring pattern 3' is printed using a conductive paste on the surface of a green sheet 2' to prepare a dried sheet. Similarly, second and third green sheets are also prepared.

(b) Next, on a silicon nitride substrate 1, the sheets prepared in the step (a) are sequentially stacked so that necessary electrode connection can be provided.

(c) Next, the plurality of green sheets overlaid on the silicon nitride substrate 1 in the step (b) are heated and pressurized together with the silicon nitride substrate 1 to produce an integrated composite laminate.

(d) Finally, the composite laminate is fired at a temperature of 850° C. to 1000° C. in a firing furnace, whereby the silicon nitride substrate 1 and the ceramic layer 2 are bonded to each other, which makes it possible to provide a composite ceramic substrate having a wiring layer 3.

As another producing flow, FIG. 4 shows a producing flow of a ceramic substrate according to another embodiment of the present invention.

(a) A via 4 is formed in a sintered silicon nitride substrate 1 by laser processing or the like, and the via 4 is filled with a conductive paste containing Ag, Cu or the like.

(b) A green sheet is formed from an LTCC material according to the present invention, and a via 4 is then formed so that a necessary circuit can be formed. The via 4 is filled with a conductive paste, and a wiring pattern 3' is printed on the surface of a green sheet 2' to produce one layer constituting a laminate.

(c) The plurality of green sheets produced in the step (b) are stacked, heated and pressurized to produce an integrated laminate.

(d) The laminate produced in the step (c) is heated and pressurized on the silicon nitride substrate 1 produced in the step (a) to produce an integrated composite laminate. The laminate can be integrated with each of both the surfaces.

The sheets produced in the step (b) can also be sequentially stacked on the silicon nitride substrate 1 produced in the step (a), followed by heating and pressurizing to produce an integrated composite laminate.

The composite laminate produced in the step (d) can be fired in a firing furnace, whereby the silicon nitride substrate 1 and the ceramic layer 2 are bonded to each other, which makes it possible to produce a composite ceramic substrate having a wiring layer 3. This producing method makes it possible to secure connection between circuits formed on the front and back surfaces. Also in this case, in the firing step, the green sheet is restrained in sintering shrinkage in the in-plane direction of the silicon nitride substrate 1, and sintered and shrunk only in the thickness direction, to provide the densified green sheet.

Figure 5:
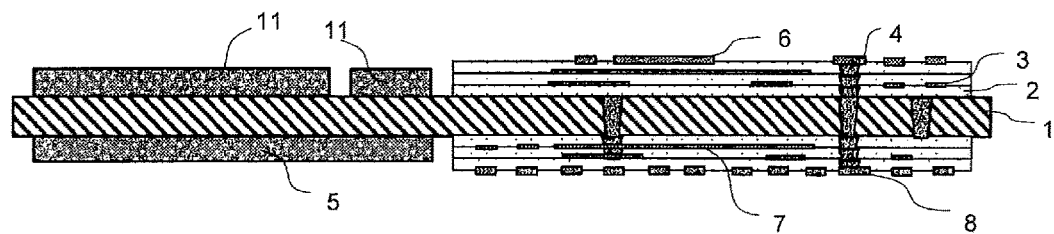
FIG. 5 is a schematic cross-sectional view of a ceramic substrate according to another embodiment of the present invention.

Furthermore, another structural example of the ceramic substrate of the present invention is shown in FIG. 5. An example of a module using the ceramic substrate is shown in FIG. 6.

FIG. 5 shows a ceramic substrate in which a ceramic layer 2 is bonded to a part of a silicon nitride substrate 1 and a thick copper plate 11 for circuit and a thick copper plate 5 for heat radiation are bonded to the other part. The ceramic substrate includes a device mounting pad 6 formed of a wiring layer on the main surface of a ceramic layer above the right side of FIG. 5, an electrode 7 for inductor or capacitor formed of a wiring layer 3 of the ceramic layer 2 on the upper side of FIG. 5, and a device mounting pad 8 formed of a wiring layer 3 on the main surface of the ceramic layer 2 on the lower side of FIG. 5. On the left side of FIG. 5, the thick copper plate 11 for circuit and the thick copper plate 5 for heat radiation are bonded to each other. Known methods such as a metallization method, a DBC (Direct Bonding Cu) method, and an active metal method can be adopted for bonding the copper plate and the silicon nitride substrate 1.

Figure 6:
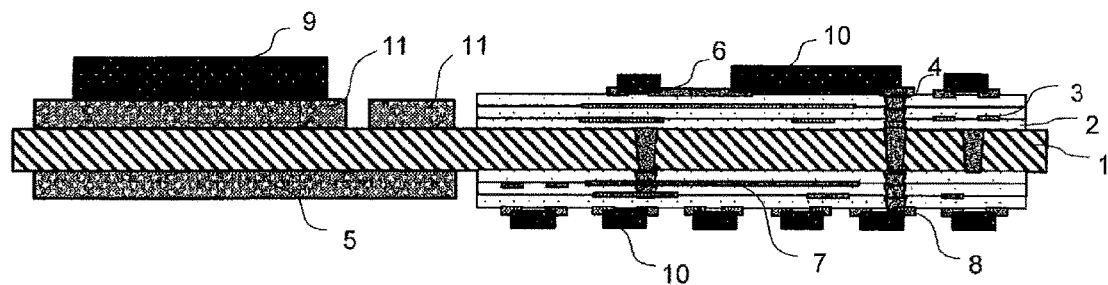
FIG. 6 shows an example of a module using a ceramic substrate of the present invention.
Figure 8:
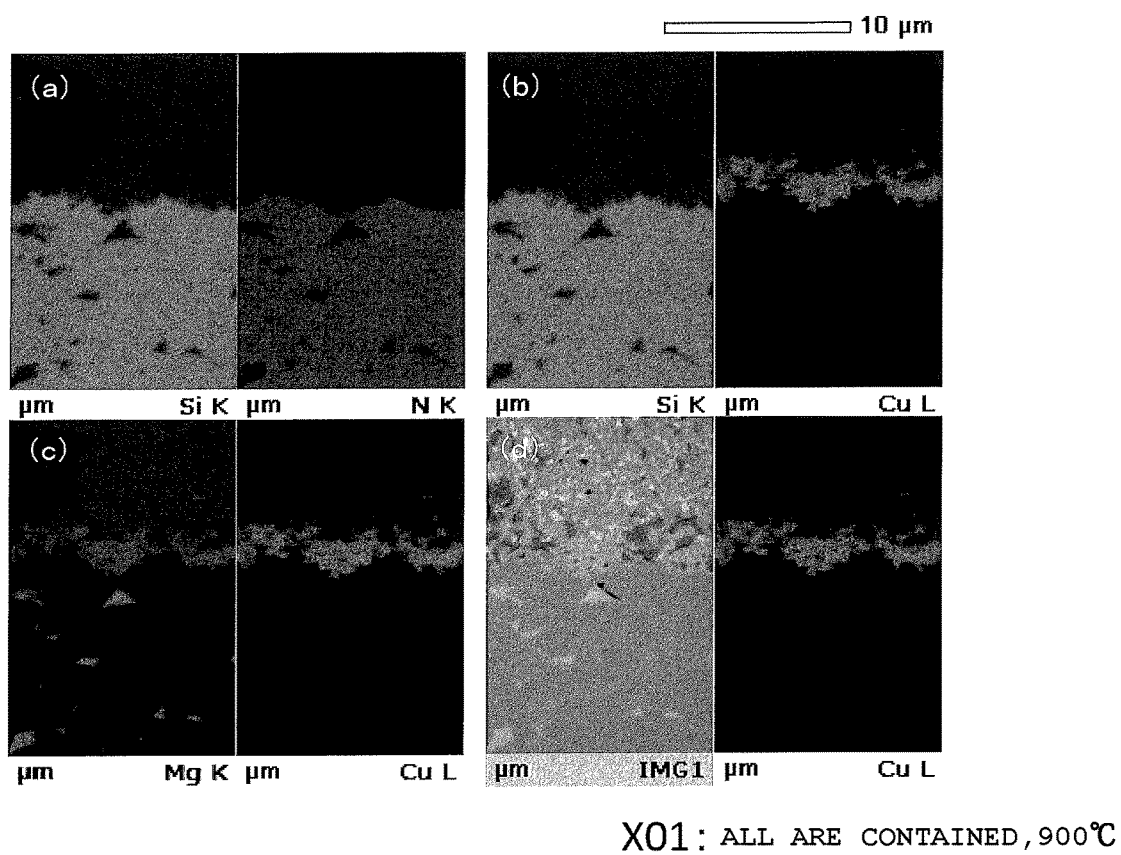
FIG. 8 is a SEM-EDX mapping photograph of Example 2 (900° C.)
Figure 9:
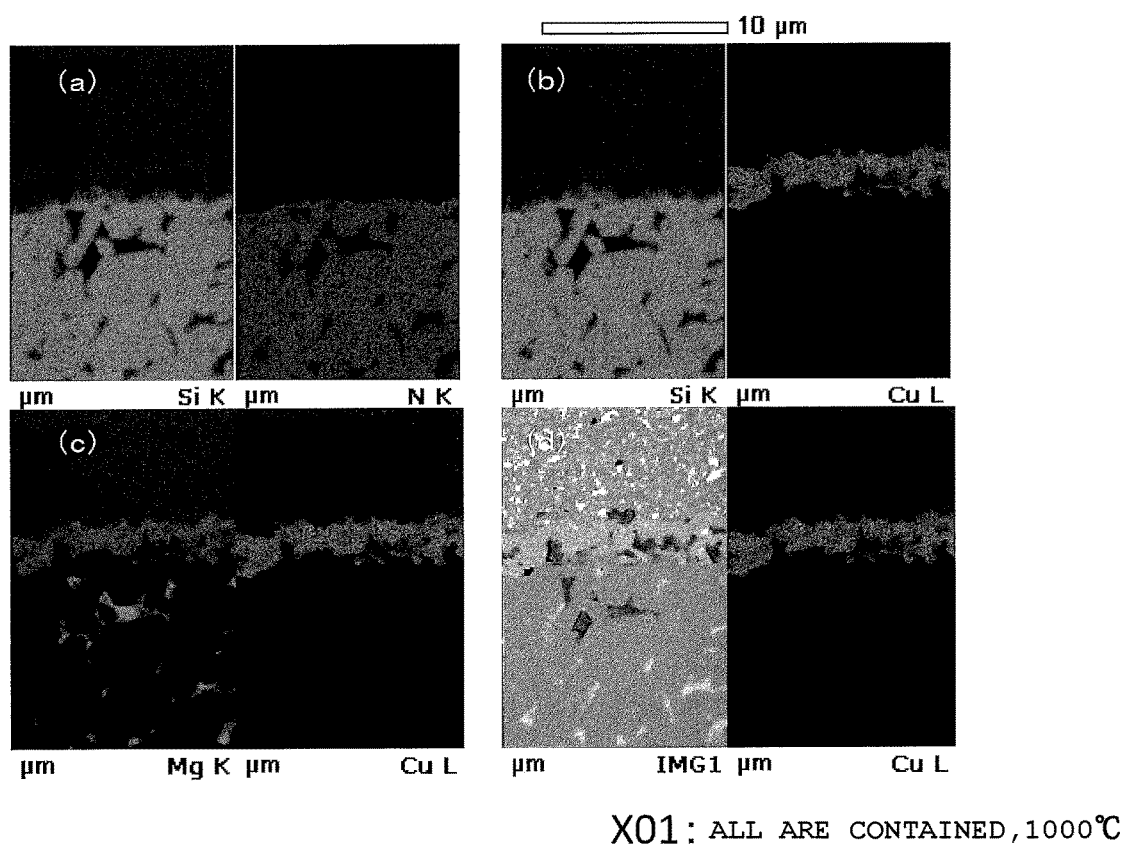
FIG. 9 is a SEM-EDX mapping photograph of Example 2 (1000° C.)

Furthermore, FIG. 6 shows the structural example of the module using the ceramic substrate of the present invention. A power semiconductor 9 and a SMD 10 can be mounted on the device mounting pads 6, 8 and the thick copper plate 11 for the circuit formed on the ceramic substrate. The SMD (Surface Mount Device) is an electronic component such as an LSI, a resistor, a capacitor, or an inductor which can be mounted on a substrate by surface mounting technology.

EXAMPLES

Hereinafter, the present invention will be described in detail with reference to Examples, but the present invention is not limited to the following Examples unless the present invention goes beyond the gist thereof. First, measurement conditions, methods and the like for various items evaluated in Examples will be collectively described.

Evaluations (1) Relative Permittivity and Dielectric Loss of Dielectric Ceramic Material Constituting Ceramic Layer Dielectric characteristics were evaluated by a dielectric resonator method (according to JIS R1627) using a network analyzer (8720D manufactured by HEWLETT PACKARD). The resonance frequency f and no-load Q value of a sample having a predetermined shape (for example, 11 mm in diameter and 5.5 mm in thickness) were measured to obtain an fQ value. The dielectric loss tan δ was calculated from the no-load Q value, and the relative permittivity was calculated from the relationship between f and the dimension of the sample. The dimension was set so as to set the resonance frequency to 15 GHz.

(2) (Thermal Expansion Coefficient)

A cylindrical sample having a diameter of 4 mm and a height of 10 mm was produced, and the thermal expansion coefficient (40 to 400° C.) of the cylindrical sample was measured by TMA8140 manufactured by Rigaku Corporation.

(3) Thermal Conductivity

The thermal conductivity at 24° C. was measured using a laser flash method thermal property measuring device manufactured by Kyoto Electronics Manufacturing Co., Ltd.

(4) Bonding Property

The presence or absence of peeling between a silicon nitride substrate and a ceramic layer was visually observed.

(5) Observation of Bonding State and Element Mapping at Bonding Interface

The interface between the silicon nitride substrate and the ceramic layer was observed with a scanning electron microscope (FEM-SEM, JSM-7800 manufactured by JEOL Ltd., magnification ratio: 2000 times).

Furthermore, the presence positions of elements (B, C, O, Mg, Al, Si, N, Bi, Cu, Y, Mn) were examined by mapping using an energy dispersive X-ray analyzer (EDX, JED-2300 SD30 manufactured by JEOL Ltd., acceleration voltage 5 kV) attached to the scanning electron microscope. The dispersion state was examined by element mapping using an X-ray microanalyzer (EPMA, EPMA-1610 manufactured by Shimadzu Corporation, acceleration voltage: 15 kV, beam diameter: 1 μm).

(6) Density

The density was calculated from the outer diameter, thickness, and weight of the sample.

(7) X-Ray Diffraction Intensity (XRD)

X-ray diffraction measurement was performed using a multifunctional X-ray diffractometer MRD (manufactured by Spectris Co., Ltd.) with Cu-Kα as a ray source.

Example 1

In Example 1, an LTCC material described in Table 1 was used as a ceramic material for forming a ceramic layer. Five green sheets each containing the LTCC material described in Table 1 and a binder were overlaid on a silicon nitride substrate having a thickness of about 300 μm (thickness of one green sheet: about 80 μm), and heated and pressurized under a pressure of 40 MPa at 85° C. for 10 minutes, to obtain a composite laminate. This was degreased at 600° C., and then sintered at 900° C. for 2 hours to produce a ceramic substrate having dimensions of 10 mm in length×10 mm in width×0.6 mm in thickness. The LTCC material corresponded to the aforementioned first aspect in which the main ingredients and the accessory ingredients were mixed and calcined. According to X-ray diffraction measurement, cordierite was a main phase.

TABLE 1

| | Main ingredients | | | Accessory ingredients | | | |
|---|---|---|---|---|---|---|---|
| | MgO (% by mass) | $Al_2O_3$ (% by mass) | $SiO_2$ (% by mass) | $Bi_2O_3$ (part by mass) | $H_3BO_3$ (part by mass) | CuO (part by mass) | $Mn_3O_4$ (part by mass) |
| Example 1 | 15.00 | 35.00 | 50.00 | 6.20 | 4.40 | 3.72 | 1.24 |

The silicon nitride substrate used was previously produced according to the following procedure. First, a MgO powder (3% by mass) and a $Y_2O_3$ powder (2% by mass) as sintering aids were added to a silicon nitride ($Si_3N_4$) powder (95% by mass), followed by pulverizing in ethanol, to obtain a pulverized product. A binder was added to the pulverized product, followed by mixing in a ball mill or the like to form a slurry. The slurry containing the silicon nitride powder was sheet-molded by a doctor blade method. The obtained green sheet was cut into predetermined dimensions, and fired at 1900° C. in a nitrogen gas atmosphere for 5 hours to obtain a silicon nitride substrate having dimensions of 130 mm in length×200 mm in width×0.3 mm in thickness. As each of ceramic substrates produced in the following Examples and Comparative Examples, the silicon nitride substrate produced according to the procedure was used.

Table 2 shows the results of evaluating the dielectric characteristics and physical property values of the ceramic layer and silicon nitride substrate. As a result of confirming the bonding state or the like of the ceramic substrate, peeling and cracking were not confirmed at the bonding interface between the silicon nitride substrate and the ceramic layer. The difference in thermal expansion coefficient between the silicon nitride substrate and the ceramic layer was within ±2 ppm/° C. According to the composition mapping of the bonding interface by SEM, a region containing both many O elements and many Si elements was formed at the interface between the ceramic layer and the silicon nitride substrate. Si is presumed to be present in an oxide state in the region.

TABLE 2

| | Thermal expansion coefficient (ppm/° C.) | Thermal conductivity (W/m · K) | Relative permittivity ∈r | Dielectric loss (tanδ × $10^{-4}$) |
|---|---|---|---|---|
| Ceramic layer | 3 | 3 | 5.2 | 5 |
| Silicon nitride substrate | 3 | 90 | 9 | >5 |

Comparative Example 1

A commercially available green sheet made of an LTCC material was prepared, overlaid on the silicon nitride substrate used in Example 1, and heated and pressurized under a pressure of 40 MPa at 85° C. for 10 minutes to obtain a composite laminate. This was degreased at 600° C. in the same manner as in Example 1, and then sintered at 900° C. for 2 hours to produce a ceramic substrate having dimensions of 10 mm in length×10 mm in width×0.6 mm in thickness.

In the ceramic substrate of Comparative Example 1, a ceramic layer were peeled off. Table 3 shows the dielectric characteristics and physical property values of the ceramic layer obtained in the green sheet used in Comparative Example 1. The difference in thermal expansion coefficient between the silicon nitride substrate and the ceramic layer exceeded ±2 ppm/° C.

TABLE 3

| | Green sheet Name of product | Thermal expansion coefficient (ppm/° C.) | Thermal conductivity (W/ m · K) | Relative permittivity ∈r | Dielectric loss (tanδ × 10⁻⁴) |
|---|---|---|---|---|---|
| Comparative Example 1 | GCS71 manufactured by Yamamura Glass Co., Ltd. | 5.7 | 2.2 | 7 | 50 |

Example 2

An experiment was performed using a material described in Table 1 as an LTCC material forming a ceramic layer. A paste composed of a material shown in Table 1 and a vehicle was directly applied to a silicon nitride substrate used in Example 1 to produce a composite laminate. The paste will be described below.
(Mixing)
Raw materials of the LTCC material were weighed according to a mass ratio shown in Table 1 (total: 800 g). The raw materials and 1,500 g of ethanol were mixed and pulverized for 40 hours with 10 kg of $Y_2O_3$ stabilized zirconia balls each having a diameter of 5 mm in a 5-L nylon ball mill pot to obtain a slurry. The concentration of the slurry was adjusted to 35% by mass.
(Calcination)
The mixed slurry was heated and dried to obtain a dried product, and the dried product was then crushed in a mortar to obtain a mixed powder. The mixed powder was caused to pass through a sieve having a mesh size of 500 μm. The mixed powder was charged into an alumina crucible, and calcined in the air at 1050° C. for 2 hours to obtain an LTCC material.
(Pulverization)
120 g of ethanol was used for 60 g of the calcined powder (LTCC material). 1 kg of $Y_2O_3$ stabilized zirconia balls each having a diameter of 5 mm, the calcined powder, and ethanol were charged into a 0.5-L polypropylene ball mill pot, and pulverized for 92 hours to obtain a slurry.
(Drying, Crushing)
The slurry was dried to obtain a dried product, and the dried product was then caused to pass through a sieve having a mesh size of 150 μm.
(Paste Formation)
80 g of butyl carbitol acetate (BCA) and 11 g of ethyl cellulose (EC) were mixed in a beaker, then dissolved by heating at 60° C. for 6 hours, and allowed to stand overnight to obtain a vehicle. 12 g of the pulverized powder was charged into the beaker containing 16.5 g of the obtained vehicle, mixed, and then caused to pass through a three-roll mill twice to obtain a paste containing the LTCC material.
(Application to Silicon Nitride Substrate)
Three Kapton tapes (about 150 μm/tape) manufactured by Nitto Denko Corporation were attached to a silicon nitride substrate with a width of 10 mm. The paste was applied to the silicon nitride substrate at a thickness of about 450 μm in a state where a cutter blade was guided with the Kapton tape, followed by drying at 60° C. for 3 hours, to obtain a composite laminate in which a ceramic material film (may be referred to as green layer) was integrated on the silicon nitride substrate.
(Firing)
The composite laminate was fired at 900° C. and 1000° C. in a batch type muffle furnace (temperature increasing-cooling: 200° C./hour, sustained for 2 hours) to obtain a ceramic substrate in which the silicon nitride substrate and the ceramic layer were bonded to each other, with dimensions of 130 mm in length×200 mm in width×0.6 mm in thickness. In the ceramic substrate, the thickness of the silicon nitride substrate part is 0.3 mm, and the thickness of the ceramic layer is 0.3 mm.

Examples 3 to 5

A ceramic substrate was produced in the same manner as in Example 2 except that the following steps were performed.
(Mixing)
Based on 100% by mass of the main ingredients of the ceramic layer, $SiO_2$, $Al_2O_3$, and MgO were weighed according to a mass ratio (total: 800 g) of $SiO_2$: 50% by mass, $Al_2O_3$: 35% by mass, and MgO: 15% by mass, and 1500 g of ion exchanged water was used. 10 kg of $Y_2O_3$ stabilized zirconia balls each having a diameter of 5 mm, the raw materials, and ion exchanged water were charged into a 5-L nylon ball mill pot, and mixed and pulverized for 40 hours.
(Calcination)
The mixed slurry was heated and dried, and then crushed in a mortar to obtain a mixed powder. The mixed powder was caused to pass through a sieve having a mesh size of 500 μm. The mixed powder was charged into an alumina crucible, and calcined in the air at 1100° C. for 2 hours.
(Preliminary Pulverization)
120 g of ethanol was used for 60 g of the calcined powder. 1 kg of $Y_2O_3$ stabilized zirconia balls each having a diameter of 5 mm, the calcined powder, and ethanol were charged into a 0.5-L polypropylene ball mill pot, and pulverized for 70 hours to obtain a preliminarily pulverized slurry.
(Blending)
0.5 kg of $Y_2O_3$ stabilized zirconia balls each having a diameter of 2 mm and 35 g of the preliminarily pulverized slurry were placed in a 0.25-L polypropylene ball mill pot. Furthermore, accessory ingredients were blended so as to provide a ratio shown in Table 4, followed by pulverizing for 16 hours to obtain an LTCC material. The LTCC material corresponded to the aforementioned second aspect in which the main ingredients were calcined, and then mixed with the accessory ingredients. X-ray diffraction measurement confirmed that the main phase was made of $Al_2O_3$ and the glass phase.

Comparative Examples 2 and 3

Ceramic substrates were produced in the same manner as in Example 3 except that main ingredients and accessory ingredients were weighed according to mass ratios in Table 4 for Comparative Examples 2 to 3.

TABLE 4

| | Main ingredients (% by mass) | Accessory ingredients | | | |
|---|---|---|---|---|---|
| | (calcined powders of MgO, $Al_2O_3$, $SiO_2$) | $Bi_2O_3$ (part by mass) | $H_3BO_3$ (part by mass) | CuO (part by mass) | $Mn_3O_4$ (part by mass) |
| Example 3 | 84.32 | 6.79 | 4.84 | 4.05 | 0 |
| Example 4 | 86.64 | 6.98 | 4.97 | 0 | 1.41 |
| Example 5 | 87.35 | 7.04 | 0 | 4.19 | 1.42 |
| Comparative Example 2 | 93.96 | 0 | 0 | 4.51 | 1.53 |

TABLE 4-continued

| | Main ingredients (% by mass) | Accessory ingredients | | | |
|---|---|---|---|---|---|
| | (calcined powders of MgO, Al$_2$O$_3$, SiO$_2$) | Bi$_2$O$_3$ (part by mass) | H$_3$BO$_3$ (part by mass) | CuO (part by mass) | Mn$_3$O$_4$ (part by mass) |
| Comparative Example 3 | 100 | 0 | 0 | 0 | 0 |

Examples 6 to 8

Ceramic substrates were produced in the same manner as in Examples 3 to 5 except that a commercially available cordierite material (product name: CC1000, composition: 2MgO.2Al$_2$O$_3$.5SiO$_2$, BET: 12 m$^2$/g, manufactured by Marusu Glaze Co., Ltd.) was used in place of the mixing and calcining steps of Examples 3 to 5. An LTCC material containing the commercially available cordierite as main ingredients corresponded to the aforementioned third aspect. X-ray diffraction measurement confirmed that cordierite was a main phase.

Comparative Examples 4 and 5

Ceramic substrates were produced in the same manner as in Example 6 except that, in Comparative Examples 4 to 5, main ingredients and accessory ingredients were weighed according to mass ratios in Table 5.

TABLE 5

| | Main ingredients (% by mass) | Accessory ingredients | | | |
|---|---|---|---|---|---|
| | (commercially available cordierite) | Bi$_2$O$_3$ (part by mass) | H$_3$BO$_3$ (part by mass) | CuO (part by mass) | Mn$_3$O$_4$ (part by mass) |
| Example 6 | 84.12 | 6.88 | 4.90 | 4.10 | 0 |
| Example 7 | 86.46 | 7.07 | 5.04 | 0 | 1.43 |
| Example 8 | 87.19 | 7.13 | 0 | 4.25 | 1.44 |
| Comparative Example 4 | 93.87 | 0 | 0 | 4.57 | 1.55 |
| Comparative Example 5 | 100 | 0 | 0 | 0 | 0 |

The evaluation results on the bonding properties of Examples 2 to 8 and Comparative Examples 2 to 5 are shown in FIGS. 7 to 15.

FIG. 7 shows the SEM-EDX mapping images of a Si element (left figure) and N element (right figure) in Example 2 (magnification ratio: 2000 times). The above figure is an enlarged view of a white frame dotted line part. In FIG. 7(a), the firing temperature is 900° C., and in FIG. 7(b), the firing temperature is 1000° C. The lower side (gray portion) is the silicon nitride substrate, and the upper side (black portion) is the ceramic layer. The positional relationship between the ceramic layer and the silicon nitride substrate is the same also in the subsequent SEM-EDX mapping image. The boundary of the bonding interface of the silicon nitride substrate/ceramic layer was determined by the presence or absence of the N element. N is not present in the ceramic layer, whereby the N presence region indicates a region where the silicon nitride substrate is present. From the SEM-EDX mapping image of the Si element in FIG. 7(a), it is found that a Si concentrated region (colored portion above the boundary line) is present on the ceramic layer side of the bonding interface. From the enlarged view, it is found that the Si concentrated region is present along the bonding interface. Furthermore, as shown in FIG. 7(b), it was found that, when the firing temperature is increased, the Si concentrated region at the interface is increased.

FIGS. 8 to 14 show the SEM-EDX mapping photographs of Examples (magnification ratio: 2000 times). When the bonding interface between the silicon nitride substrate and the ceramic layer was observed, it was found that all the samples include a Si concentrated region (a region containing many Si elements) on the ceramic layer side of the bonding interface.

FIGS. 8(a) to 8(d) are the SEM-EDX mapping photographs of Example 2 (firing temperature: 900° C.). FIG. 8(a) is a SEM-EDX mapping photograph in the same field of view as that in FIG. 7(a), and the whole observation field of view is made clear exclusive of a white frame or the like. FIG. 8(b) shows the SEM-EDX mapping images of a Si element (left figure) as the main ingredients of the ceramic layer and Cu element (right figure) as the accessory ingredients of the ceramic layer. From FIG. 8(b), a portion where the Cu concentrated region and the silicon nitride substrate seemed to be directly bonded to each other could also be observed. FIG. 8(c) shows the SEM-EDX mapping images of a Mg element (left figure) and Cu element (right figure) as the main ingredients of the ceramic layer. From FIG. 8(c), it could be observed that Mg was concentrated near the interface, and present exactly at the same position as that of Cu. It could be observed that Mg is also necessarily concentrated in a Cu concentrated part. FIG. 8(d) shows a photograph (left figure) showing a SEM observation field image and a SEM-EDX mapping image of a Cu element (right figure). From FIG. 8(d), the Cu concentrated part seemed to have a different microstructure from that of an ordinary part of the ceramic layer. Other elements were also analyzed, but B was difficult to detect, and no significant behavior was clearly seen.

The O amount tended to be somewhat less near the Cu and Mg concentrated regions near the interface. No changes in the segregation of Al as the main ingredients of the ceramic layer, the segregation of N as the main ingredients of the silicon nitride substrate, and the segregation of Bi as the accessory ingredients of the ceramic layer, or the like were seen near the interface. Y as the accessory ingredients of the silicon nitride substrate was also detected in the grain boundary phase of the ceramic layer, but the LTCC material was possibly mixed from the media of the ball mill (Y$_2$O$_3$ partially stabilized zirconia balls) in the producing step.

FIGS. 9(a) to 9(d) are the SEM-EDX mapping photographs of Example 2 (firing temperature: 1000° C.). FIG. 9(a) is a SEM-EDX mapping photograph in the same field of view as that of FIG. 7(b), and the whole observation field of view is made clear exclusive of a white frame or the like. FIG. 9(b) shows the SEM-EDX mapping images of a Si element (left figure) and Cu element (right figure). FIG. 9(c) shows the SEM-EDX mapping images of a Mg element (left figure) and Cu element (right figure). FIG. 9(d) shows a photograph (left figure) showing a SEM observation field image and a SEM-EDX mapping image of a Cu element (right figure). It was confirmed that the behavior of each elemental ingredient is similar to that of FIG. 8.

FIGS. 10(a) to 10(d) are the SEM-EDX mapping photographs of Example 6 (firing temperature: 1000° C.) (magnification ratio: 2000 times). FIG. 10(a) is the SEM-EDX mapping images of a Si element (left figure) and N element (right figure). FIG. 10(b) shows the SEM-EDX mapping images of the Si element (left figure) and Cu element (right figure). FIG. 10(c) shows the SEM-EDX mapping images of a Mg element (left figure) and Cu element (right figure). FIG. 10(d) shows a photograph (left figure) showing a SEM observation field image and a SEM-EDX mapping image of a Cu element (right figure). Also in this case, it is found that a Si concentrated region is present on the ceramic layer side, and the concentrated region is enlarged as compared with that in Example 2 and Examples 3 and 4. From FIG. 10(b), a Cu concentrated region was not seen at the interface, but it was observed that the Cu concentrated region is present in the grain boundary phase in the silicon nitride substrate. However, the cause is unknown. From FIG. 10(c), Mg is seen in the Cu concentrated region in the silicon nitride substrate. However, Mg is originally contained in the grain boundary phase, whereby Mg is not said to be diffused from the ceramic layer. From FIG. 10(d), the Cu concentrated part has a portion similar to the grain boundary phase in silicon nitride, but the Cu concentrated part has a slightly different color tone. The other elemental ingredients exhibited the same behaviors as those in FIG. 8 in spite of slight differences.

FIGS. 11(a) to 11(d) are the SEM-EDX mapping photographs of Example 3 (firing temperature: 1000° C.) (magnification ratio: 2000 times). FIG. 11(a) is the SEM-EDX mapping images of a Si element (left figure) and N element (right figure). FIG. 11(b) shows the SEM-EDX mapping images of a Si element (left figure) and Cu element (right figure). FIG. 11(c) shows the SEM-EDX mapping images of a Mg element (left figure) and Cu element (right figure). FIG. 11(d) shows a photograph (left figure) showing a SEM observation field image and a SEM-EDX mapping image of the Cu element (right figure). Also in this case, it is found that a Si concentrated region is present on the ceramic layer side, and the concentrated region is enlarged as compared with that in Example 2 (900° C.). From FIG. 11(b), there is also a portion where the Cu concentrated region and the silicon nitride substrate seem to be directly bonded to each other. From FIG. 11(c), Cu is always present in a Mg concentrated part of the interface. Meanwhile, no Mg is present in the Cu concentrated part on the ceramic layer side with respect to the interface (Bi is concentrated). That is, Bi is concentrated near the interface, but the amount of Bi is small near the interface. From FIG. 11(d), the Cu concentrated part has a different microstructure from that of an ordinary part of the ceramic layer. The other elemental ingredients exhibited the same behaviors as those in FIG. 8 in spite of slight differences.

FIGS. 12(a) to 12(d) are the SEM-EDX mapping photographs of Example 7 (firing temperature: 1000° C.). FIG. 12(a) is the SEM-EDX mapping images of a Si element (left figure) and N element (right figure). FIG. 12(b) shows the SEM-EDX mapping images of the Si element (left figure) and Mg element (right figure). FIG. 12(c) shows the SEM-EDX mapping images of a Mg element (left figure) and Bi element (right figure). FIG. 12(d) shows a photograph (left figure) showing a SEM observation field image and a SEM-EDX mapping image of the Bi element (right figure). From FIG. 12(a), the Si concentrated region is present on the ceramic layer side, and the concentrated region is enlarged as compared with those in Example 2 and Examples 3 and 4. From FIG. 12(b), no Mg concentrated region is seen at the bonding interface. From FIG. 12(c), no Bi concentrated region is seen at the bonding interface. Clear Bi concentration in the vicinity of the interface is not seen. From FIG. 12(d), Bi is concentrated in the crystal grain boundary of the ceramic layer. The other elemental ingredients exhibited the same behaviors as those in FIG. 8 in spite of slight differences.

FIGS. 13(a) to 13(d) are the SEM-EDX mapping photographs of Example 4 (firing temperature: 900° C.). FIG. 13(a) is the SEM-EDX mapping images of a Si element (left figure) and N element (right figure). FIG. 13(b) shows the SEM-EDX mapping images of the Si element (left figure) and Mg element (right figure). FIG. 13(c) shows the SEM-EDX mapping images of the Mg element (left figure) and Bi element (right figure). FIG. 13(d) shows a photograph (left figure) showing a SEM observation field image and a SEM-EDX mapping image of the Bi element (right figure). From FIG. 13(a), it was observed that a Si concentrated region is very slightly present on the ceramic layer side. From FIG. 13(b), no Mg concentrated region is seen at the interface. From FIG. 13(c), no Bi concentrated region was seen at the interface, and from FIG. 13(d), it was confirmed that Bi is concentrated in the crystal grain boundary of the ceramic layer. The other elemental ingredients exhibited the same behaviors as those in FIG. 8 in spite of slight differences.

FIGS. 14(a) to 14(d) are the SEM-EDX mapping photographs of Example 8 (firing temperature: 1000° C.). FIG. 14(a) is the SEM-EDX mapping images of a Si element (left figure) and N element (right figure). FIG. 14(b) shows the SEM-EDX mapping images of the Si element (left figure) and Cu element (right figure). FIG. 14(c) shows the SEM-EDX mapping images of a Mg element (left figure) and Cu element (right figure). FIG. 14(d) shows a photograph (left figure) showing a SEM observation field image and a SEM-EDX mapping image of the Cu element (right figure). From FIG. 14(a), a Si concentrated region is present on the ceramic layer side, and the concentrated region is enlarged as compared with those in Example 2 and Examples 3 and 4. From FIG. 14(b), no Cu concentrated region is seen in the entire interface, but Cu concentration is present on the silicon nitride substrate side of the interface. From FIG. 14(c), no Mg concentrated region is seen in the entire interface, but it is considered that Mg may also be concentrated on the silicon nitride side of the interface. From FIG. 14(d), the Cu concentrated part has a different microstructure from that of an ordinary part of the ceramic layer. The other elemental ingredients exhibited the same behaviors as those in FIG. 8 in spite of slight differences.

Also in Example 5 (firing temperature: 1000° C.), as with Examples 2 to 3, a Si concentrated region was observed on the ceramic layer side. The other elemental ingredients exhibited the same behaviors as those in FIG. 8 in spite of slight differences.

In Comparative Examples 2 to 5, many voids were present in the ceramic layer, whereby the densification did not proceed. In the case of Comparative Examples 3 and 5 which did not simultaneously contain B and Bi during firing at 1000° C., it was found that the ceramic layer and the silicon nitride substrate are not bonded to each other. Even if the firing temperature was increased, and firing was performed at 1100° C., densification did not proceed, whereby firm bonding could not be obtained.

Figure 15:
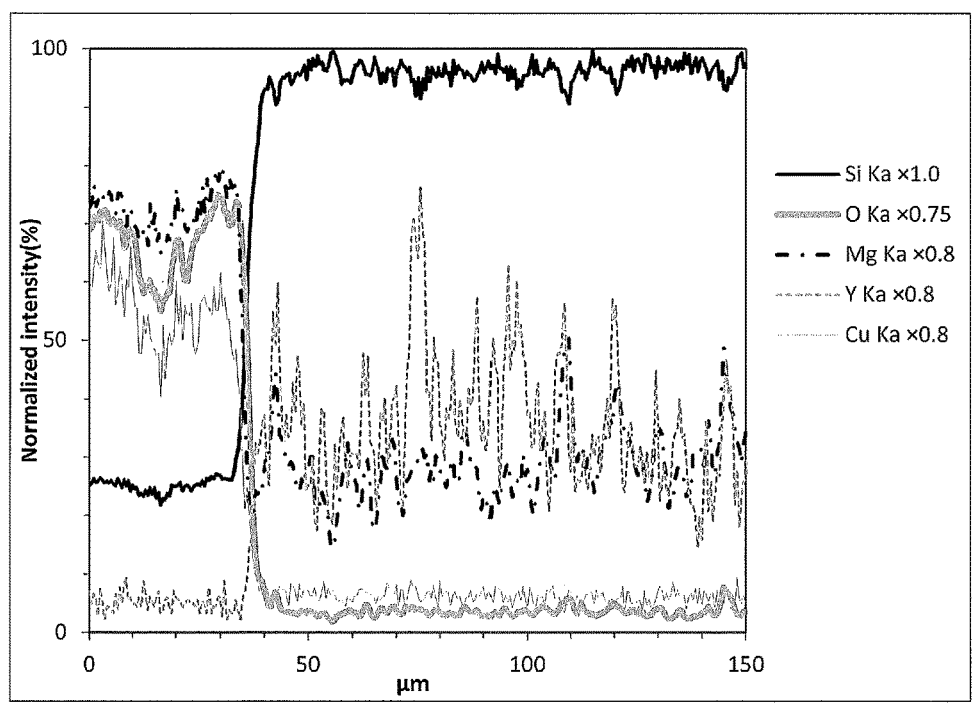
FIG. 15 shows the results of FE-EPMA mapping in Example 7 (1000° C.)

FIG. 15 shows the results of line analysis of elements obtained by FE-EPMA (Field Emission-Electron Probe Micro Analysis) in Example 7 (firing temperature: 1000° C.). A horizontal axis (Y-Direction) is a thickness in a thickness direction. About 35 µm or less means a ceramic layer side, and more than about 35 µm means a silicon nitride substrate side. It is considered that the bonding interface is present at about 35 µm. There is a slope of a Si amount in the vicinity of 35 to 50 µm. There is a slope of the Si amount near the interface on the silicon nitride substrate side compared with the ceramic layer side. It is considered that the Si concentration on the ceramic layer side of the bonding interface may be mainly due to the movement of Si on the silicon nitride substrate side.

As described above, it is assumed that the formation of the Si concentrated region is different according to the method for producing the LTCC material. It is considered that the easiness of forming the Si concentrated region is influenced by the method for producing the LTCC material.

Reference Examples 1 to 3

Experiments were performed using materials described in Table 6 as LTCC materials forming a ceramic layer of the present invention.

(Mixing)

Based on 100% by mass of the main ingredients of the ceramic layer containing the accessory ingredients, the main ingredients and the accessory ingredients were weighed so that the mass ratio of Table 6 was set. Subsequently, the production was proceeded in the same manner as in Example 3 until calcination.

(Pulverization)

55 g of the obtained calcined powder was blended with the accessory ingredients so that the ratio shown in Table 6 was set, to obtain a blended product. The blended product was charged into a 0.5-L polypropylene ball mill pot together with 1 kg of $Y_2O_3$ stabilized zirconia balls each having a diameter of 5 mm, and ion exchanged water was added to the ball mill pot, to obtain a slurry. The concentration of the slurry was set to 30% by mass, and the slurry was pulverized and mixed for 23 hours.

(Molding)

The slurry was heated and dried to obtain a dried product, and the dried product was crushed in a mortar, to obtain a crushed product. A binder (PVA) was added to the crushed product to obtain a mixture, and the mixture was caused to pass through a sieve having an opening of 500 µm to obtain a granulated product. The granulated product was fired to obtain a fired product, and the fired product was then molded to have a diameter of 11 mm and a thickness of 5.5 mm to obtain a molded product. The molded product was fired at 900° C. in the air. The densities of the obtained samples of Reference Examples were measured. The results are shown in FIG. 16.

TABLE 6

|  | Main ingredients | | | Accessory ingredients | | | | |
| --- | --- | --- | --- | --- | --- | --- | --- | --- |
|  | MgO (% by mass) | $Al_2O_3$ (% by mass) | $SiO_2$ (% by mass) | $Bi_2O_3$ (part by mass) | $B_2O_3$ (part by mass) | CuO (part by mass) | $Mn_3O_4$ (part by mass) | $B_2O_3/Bi_2O_3$ weight ratio |
| Reference Example 1 | 13.2 | 30.8 | 44.0 | 6.55 | 1.09 | 2.18 | 2.18 | 0.167 |
| Reference Example 2 | 13.2 | 30.8 | 44.0 | 5.45 | 2.18 | 2.18 | 2.18 | 0.4 |
| Reference Example 3 | 13.2 | 30.8 | 44.0 | 4.36 | 3.27 | 2.18 | 2.18 | 0.75 |

Figure 16:
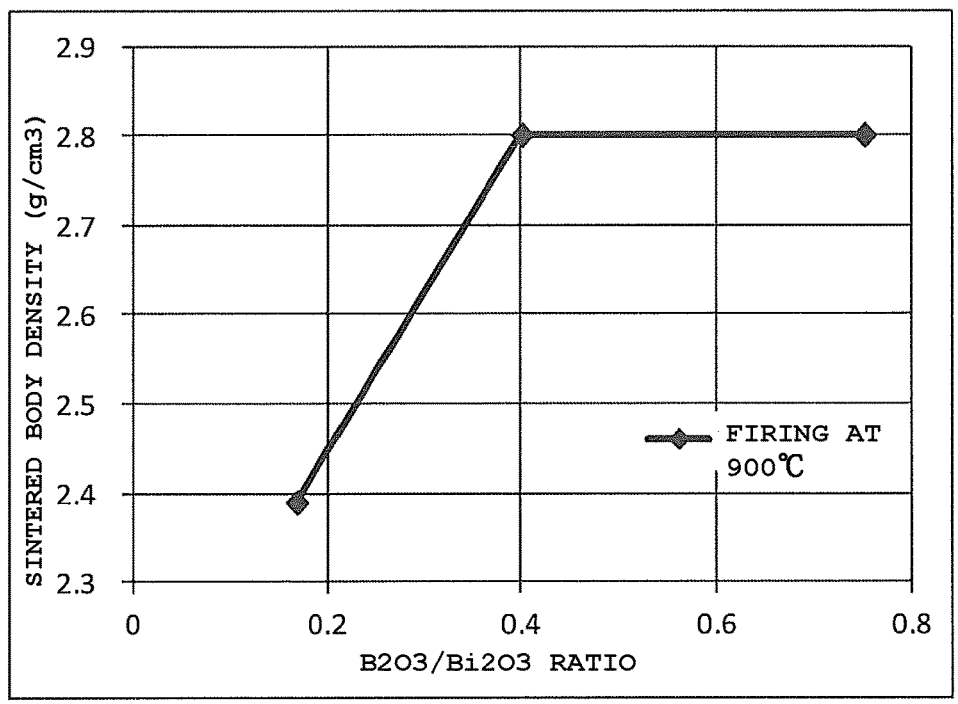
FIG. 16 shows the influence of a $B_2O_3/Bi_2O_3$ weight ratio with respect to the sintering property of LTCC on a fired body density.

FIG. 16 shows the relationship between the $B_2O_3/Bi_2O_3$ weight ratio of the LTCC material and the fired body density. It was found that, when the total amount of $B_2O_3$ and $Bi_2O_3$ is made substantially the same, and the balance is changed, firing at the same temperature causes more difficult densification as the amount of B is smaller. The experiment is an example during firing at 900° C.

Reference Examples 4 to 6

Figure 17:
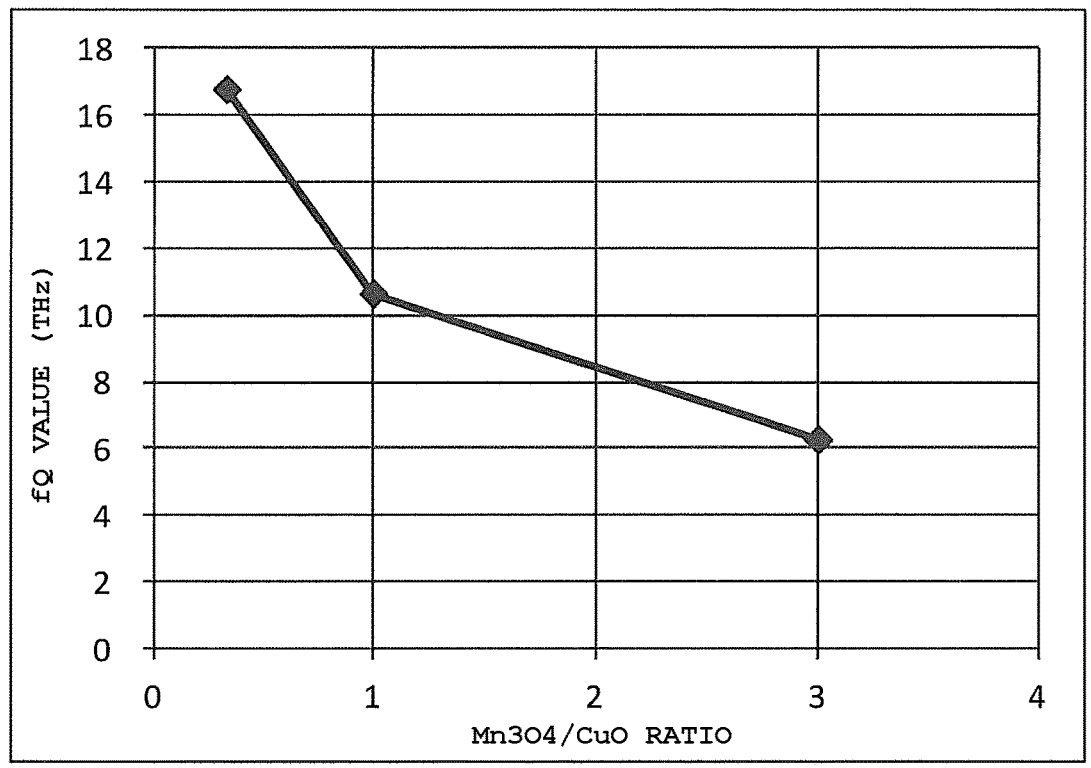
FIG. 17 shows the influence of a $Mn_3O_4/CuO$ weight ratio with respect to the sintering property of LTCC on an fQ value.

Experiments were performed using materials described in Table 7 as LTCC materials forming a ceramic layer. Samples were produced in the same manner as in Reference Examples 1 to 3 except for the use of the materials. In Reference Examples, the weight ratio of $B_2O_3/Bi_2O_3$ is kept constant at 0.4, and the weight ratios of $Mn_3O_4$ and CuO are different from each other. The resonance frequency f and no-load Q value of the obtained sample of each of Reference Examples were measured to obtain an fQ value. The results are shown in FIG. 17.

TABLE 7

|  | Main ingredients | | | Accessory ingredients | | | | |
| --- | --- | --- | --- | --- | --- | --- | --- | --- |
|  | MgO (% by mass) | $Al_2O_3$ (% by mass) | $SiO_2$ (% by mass) | $Bi_2O_3$ (part by mass) | $B_2O_3$ (part by mass) | CuO (part by mass) | $Mn_3O_4$ (part by mass) | $Mn_3O_4/CuO$ weight ratio |
| Reference Example 4 | 13.2 | 30.8 | 44.0 | 5.45 | 2.18 | 1.09 | 3.27 | 3 |
| Reference Example 5 | 13.2 | 30.8 | 44.0 | 5.45 | 2.18 | 2.18 | 2.18 | 1 |

TABLE 7-continued

| | Main ingredients | | | Accessory ingredients | | | | |
|---|---|---|---|---|---|---|---|---|
| | MgO (% by mass) | Al$_2$O$_3$ (% by mass) | SiO$_2$ (% by mass) | Bi$_2$O$_3$ (part by mass) | B$_2$O$_3$ (part by mass) | CuO (part by mass) | Mn$_3$O$_4$ (part by mass) | Mn$_3$O$_4$/CuO weight ratio |
| Reference Example 6 | 13.2 | 30.8 | 44.0 | 5.45 | 2.18 | 3.27 | 1.9 | 0.33 |

FIG. 17 shows the relationship between the Mn$_3$O$_4$/CuO weight ratio and fQ value of the LTCC material. It was found that, when the total amount of Mn$_3$O$_4$ and CuO is made substantially the same, and the balance is changed, the firing proceeds (cordierite formation proceeds) as the amount of CuO is increased. During firing at 925° C., cordierite is a main phase in each case.

Reference Examples 7 to 10

Experiments were performed using materials described in Table 8 as LTCC materials forming a ceramic layer. In each of Reference Examples, the ratios of main ingredients and accessory ingredients are made different from each other, and the ratio of Bi$_2$O$_3$, B$_2$O$_3$, CuO, or CuO as the accessory ingredients is set to be constant in Reference Examples. Using Al$_2$O$_3$ produced under the same conditions as those in Examples 3 to 5 and calcined powders made of MgO, Al$_2$O$_3$, and SiO$_2$ with a glass phase as a main phase, a firing temperature was set to 875° C. to 1050° C., and samples were produced in the same manner as in Reference Examples 1 to 3. The densities of the obtained samples of Reference Examples were measured. The results are shown in FIG. 18.

TABLE 8

| | Main ingredients (% by mass) | Accessory ingredients | | | |
|---|---|---|---|---|---|
| | (calcined powders of MgO, Al$_2$O$_3$, SiO$_2$) | Bi$_2$O$_3$ (part by mass) | B$_2$O$_3$ (part by mass) | CuO (part by mass) | Mn$_3$O$_4$ (part by mass) |
| Reference Example 7 | 94.5 | 2.5 | 1.0 | 1.0 | 1.0 |
| Reference Example 8 | 92.0 | 3.6 | 1.5 | 1.5 | 1.5 |
| Reference Example 9 | 90.0 | 4.5 | 1.8 | 1.8 | 1.8 |
| Reference Example 10 | 88.0 | 5.5 | 2.2 | 2.2 | 2.2 |

Figure 18:
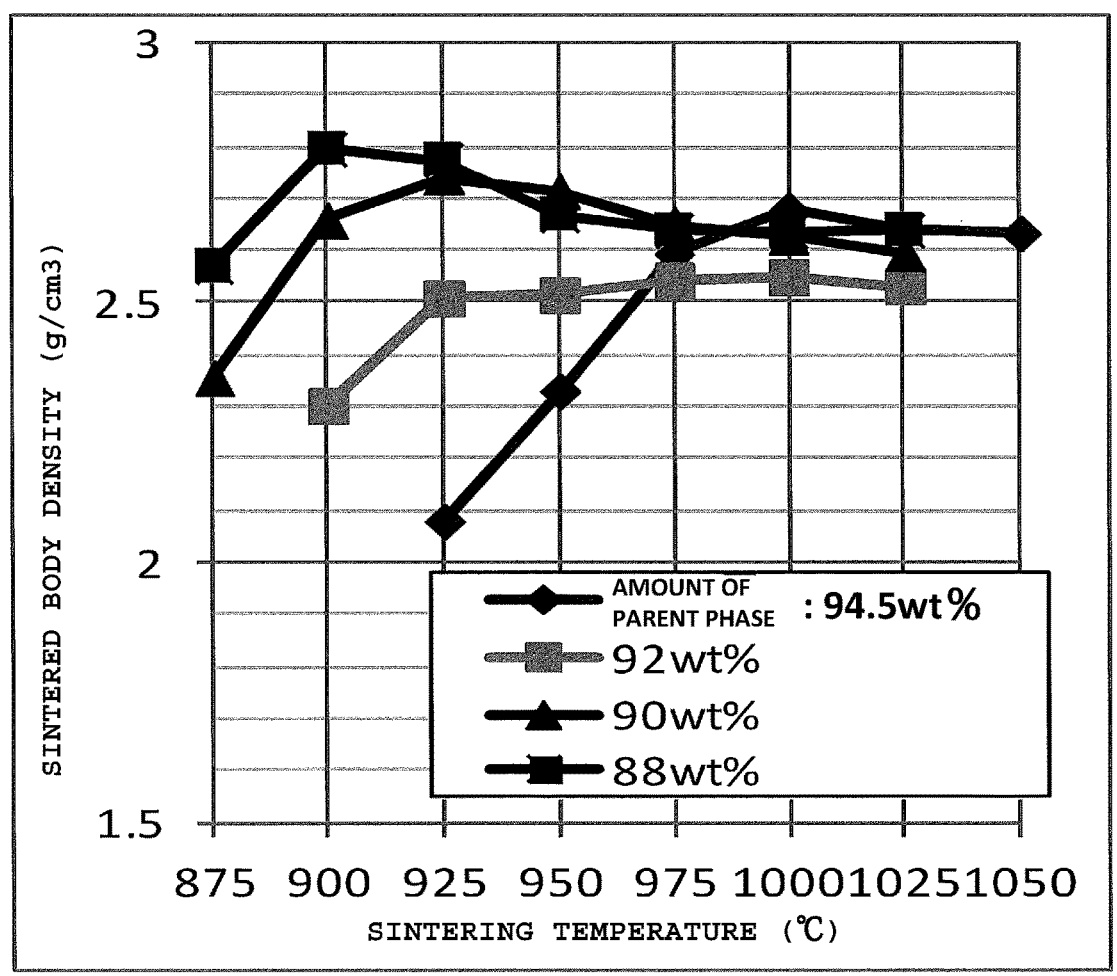
FIG. 18 shows the influence of a parent phase (main ingredients) ratio with respect to the sintering property of LTCC on a sintering density.

FIG. 18 shows the influence of the ratio of the main ingredients of the LTCC material on the sintered body density with respect to the firing temperature. It was found that the ratio of the main ingredients in the LTCC material is reduced to be likely to provide the sintered body density even during firing at low temperatures.

DESCRIPTION OF REFERENCE SIGNS

1 silicon nitride substrate
2' green sheet
2 ceramic layer
3' wiring pattern
3 wiring layer
4 connected through vias
5 thick copper plate for heat dissipation
6 device mounting pad
7 internal wiring
8 device mounting pad
9 power semiconductor
10 SMD
11 thick copper plate for circuit
S bonding interface

The invention claimed is:

1. A ceramic substrate obtained by stacking and bonding a silicon nitride substrate and a ceramic layer composed of a dielectric ceramic material,
wherein:
the dielectric ceramic material contains Mg, Al, and Si as main ingredients, and Bi or B as an accessory ingredient; and
the ceramic layer includes a region with a high Si element concentration at a bonding interface with the silicon nitride substrate.

2. The ceramic substrate according to claim 1, wherein the main ingredients of the dielectric ceramic material contain 10 to 25% by mass of Mg in terms of MgO, 15 to 46% by mass of Al in terms of Al$_2$O$_3$, and 40 to 65% by mass of Si in terms of SiO$_2$ based on 100% by mass of the main ingredients.

3. The ceramic substrate according to claim 1, wherein the accessory ingredient contains 0.1 to 10 parts by mass of Bi in terms of Bi$_2$O$_3$ or 0.1 to 10 parts by mass of B in terms of B$_2$O$_3$ based on 100 parts by mass of the main ingredients.

4. The ceramic substrate according to claim 1, wherein the dielectric ceramic material further comprises Cu as the accessory ingredient, wherein the content of Cu is 0.1 to 10 parts by mass in terms of CuO based on 100 parts by mass of the main ingredients.

5. The ceramic substrate according to claim 1, wherein the dielectric ceramic material further comprises Mn as the accessory ingredient, wherein the content of Mn is 0.1 to 10 parts by mass in terms of Mn$_3$O$_4$ based on 100 parts by mass of the main ingredients.

6. The ceramic substrate according to claim 1, wherein the ceramic layer further comprises a region with a high concentration of an element derived from the accessory ingredient in the vicinity of the region with a high Si element concentration.

7. The ceramic substrate according to claim 1, further comprising at least one wiring layer, wherein the wiring layer is made of at least one selected from the group consisting of Ag, Au, Cu, an Ag alloy, and a Cu alloy.

8. The ceramic substrate according to claim 1, wherein a difference in thermal expansion coefficient between the silicon nitride substrate and the ceramic layer is within ±2 ppm/° C.

9. A method for producing a ceramic substrate, the method comprising the steps of:
forming a green sheet which contains a ceramic material containing Mg, Al, and Si as main ingredients and Bi or B as an accessory ingredient, and a binder;

stacking at least one green sheet on a silicon nitride substrate to form a composite laminate; and firing the composite laminate at 1100° C. or lower to obtain a ceramic substrate in which a ceramic layer and the silicon nitride substrate are bonded to each other, wherein a region with a high Si element concentration is formed at a bonding interface between the ceramic layer and the silicon nitride substrate during the firing step.

10. A method for producing a ceramic substrate, the method comprising the steps of:

applying a paste which contains a ceramic material containing Mg, Al, and Si as main ingredients, and Bi or B as an accessory ingredient, and a vehicle on a silicon nitride substrate, followed by drying to form a green layer, thereby forming a composite laminate; and firing the composite laminate at 1100° C. or lower to obtain a ceramic substrate in which a ceramic layer and the silicon nitride substrate are bonded to each other, wherein a region with a high Si element concentration is formed at a bonding interface between the ceramic layer and the silicon nitride substrate during the firing step.

* * * * *